US009958769B1

(12) United States Patent
Araki et al.

(10) Patent No.: US 9,958,769 B1
(45) Date of Patent: May 1, 2018

(54) METHOD OF MANUFACTURING A PLASMON GENERATOR

(71) Applicants: Hironori Araki, Milpitas, CA (US); Yoshitaka Sasaki, Los Gatos, CA (US); Hiroyuki Ito, Milpitas, CA (US); Seiichiro Tomita, Milpitas, CA (US); Shigeki Tanemura, Milpitas, CA (US); Yukinori Ikegawa, Milpitas, CA (US)

(72) Inventors: Hironori Araki, Milpitas, CA (US); Yoshitaka Sasaki, Los Gatos, CA (US); Hiroyuki Ito, Milpitas, CA (US); Seiichiro Tomita, Milpitas, CA (US); Shigeki Tanemura, Milpitas, CA (US); Yukinori Ikegawa, Milpitas, CA (US)

(73) Assignee: HEADWAY TECHNOLOGIES, INC., Milpitas, CA (US)

(*) Notice: Subject to any disclaimer, the term of this patent is extended or adjusted under 35 U.S.C. 154(b) by 0 days. days.

(21) Appl. No.: 15/387,066

(22) Filed: Dec. 21, 2016

(51) Int. Cl.
*G03F 1/38* (2012.01)
*G03F 7/09* (2006.01)
*G11B 5/31* (2006.01)
*G11B 5/00* (2006.01)

(52) U.S. Cl.
CPC ............... *G03F 1/38* (2013.01); *G03F 7/094* (2013.01); *G11B 5/3169* (2013.01); *G11B 2005/0021* (2013.01)

(58) Field of Classification Search
CPC combination set(s) only.
See application file for complete search history.

(56) References Cited

U.S. PATENT DOCUMENTS

| 9,472,230 | B1 * | 10/2016 | Sasaki | ................... | G11B 5/012 |
| 2011/0170381 | A1 | 7/2011 | Matsumoto | | |
| 2015/0092525 | A1 * | 4/2015 | Araki | .................. | G11B 5/6088 369/13.33 |
| 2016/0307592 | A1 * | 10/2016 | Sasaki | ................... | G11B 5/012 |

* cited by examiner

*Primary Examiner* — Nadine Norton
*Assistant Examiner* — Mahmoud Dahimene
(74) *Attorney, Agent, or Firm* — Oliff PLC

(57) ABSTRACT

A plasmon generator including a wide portion and a narrow portion is manufactured by etching an initial plasmon generator using an etching mask. The etching mask includes a first mask layer for defining the shape of one of the narrow portion and the wide portion, and a second mask layer for defining the shape of the other of the narrow portion and the wide portion. The etching mask is formed by forming a first hard mask, a second initial mask layer and a second hard mask in this order on a first initial mask layer, and etching the first and second initial mask layers by using the first and second hard masks.

10 Claims, 25 Drawing Sheets

//www.w3.org/2000/svg" viewBox="0 0 100 100">

METHOD OF MANUFACTURING A PLASMON GENERATOR

BACKGROUND OF THE INVENTION

1. Field of the Invention

The present invention relates to a method of manufacturing a plasmon generator for use in thermally-assisted magnetic recording to write data on a recording medium with the coercivity thereof lowered by applying near-field light thereto.

2. Description of the Related Art

With recent increases in recording density of magnetic recording devices such as magnetic disk drives, there has been demand for improved performance of thin-film magnetic heads and recording media. Among the thin-film magnetic heads, a composite thin-film magnetic head has been used widely. The composite thin-film magnetic head has such a structure that a read head unit including a magnetoresistive element (hereinafter, also referred to as MR element) for reading and a write head unit including an induction-type electromagnetic transducer for writing are stacked on a substrate. In a magnetic disk drive, the thin-film magnetic head is mounted on a slider configured to slightly fly above the surface of a recording medium. The slider has a medium facing surface configured to face the recording medium. The medium facing surface has an air inflow end (a leading end) and an air outflow end (a trailing end).

Here, the side of the positions closer to the leading end relative to a reference position will be referred to as the leading side, and the side of the positions closer to the trailing end relative to the reference position will be referred to as the trailing side. The leading side is the rear side in the direction of travel of the recording medium relative to the slider. The trailing side is the front side in the direction of travel of the recording medium relative to the slider.

To increase the recording density of a magnetic recording device, it is effective to make the magnetic fine particles of the recording medium smaller. Making the magnetic fine particles smaller, however, disadvantageously lowers the thermal stability of magnetization of the magnetic fine particles. To overcome this problem, it is effective to increase the anisotropic energy of the magnetic fine particles. However, increasing the anisotropic energy of the magnetic fine particles leads to an increase in coercivity of the recording medium, thereby making it difficult to perform data writing with existing magnetic heads.

As a solution to the problems described above, there has been proposed a technology called thermally-assisted magnetic recording. The technology uses a recording medium having high coercivity. When writing data, a write magnetic field and heat are applied almost simultaneously to the area of the recording medium where to write data, so that the area rises in temperature and drops in coercivity for data writing. The area where data is written subsequently falls in temperature and rises in coercivity to increase the thermal stability of magnetization. Hereinafter, a magnetic head for use in thermally-assisted magnetic recording will be referred to as a thermally-assisted magnetic recording head.

In thermally-assisted magnetic recording, near-field light is typically used as a means for applying heat to the recording medium. A known method for generating near-field light is to use a plasmon generator, which is a piece of metal that generates near-field light from plasmons excited by irradiation with laser light. The laser light to be used for generating near-field light is typically guided through a waveguide, which is provided in the slider, to the plasmon generator provided near the medium facing surface of the slider.

U.S. Patent Application Publication No. 2011/0170381 A1 discloses a thermally-assisted magnetic recording head including a main pole, a waveguide and a plasmon generator. The main pole has an end face located in the medium facing surface, and produces a write magnetic field from the end face. The plasmon generator has a near-field light generating surface located in the medium facing surface. The waveguide includes a core and a cladding. In this head, the surface of the core and the surface of the plasmon generator face each other with a gap interposed therebetween. This head is configured to excite surface plasmons on the plasmon generator by using evanescent light which is generated at the surface of the core from the light propagating through the core, and to generate near-field light from the excited surface plasmons at the near-field light generating surface.

A thermally-assisted magnetic recording head suffers from the problem that heat generated by the plasmon generator causes the plasmon generator to shrink and become distant from the medium facing surface, and also causes the main pole to be corroded, thereby shortening the life of the thermally-assisted magnetic recording head.

In order to achieve higher recording density, it is essential to make the track width smaller. Making the track width smaller increases the track density. In the case of a thermally-assisted magnetic recording head including a plasmon generator, the plasmon generator produces a spot of near-field light on a recording medium. The size of the spot of near-field light will hereinafter be referred to as light spot size. It has conventionally been considered that a smaller light spot size is effective for achieving higher recording density. In order to make the light spot size smaller, it is effective to reduce the width of the near-field light generating surface of the plasmon generator.

U.S. Patent Application Publication No. 2011/0170381 A1 discloses a plasmon generator including a narrow portion and a wide portion. The narrow portion includes the near-field light generating surface located in the medium facing surface. The wide portion is located farther from the medium facing surface than is the narrow portion. Here, the length of the narrow portion in a direction perpendicular to the medium facing surface will be referred to as neck height. In the plasmon generator disclosed in U.S. Patent Application Publication No. 2011/0170381 A1, heat generated at the narrow portion, particularly at the near-field light generating surface, may cause the narrow portion to shrink and become distant from the medium facing surface, and consequently cause the plasmon generator to become unable to form a sport of near-field light on the recording medium. A conceivable countermeasure to prevent this is to reduce the neck height. More specifically, reducing the neck height can enhance the heat sink effect of the wide portion to dissipate the heat generated at the narrow portion. Reducing the neck height can also increase the efficiency of generation of near-field light.

The neck height has an influence on the performance and reliability of a thermally-assisted magnetic recording head including a plasmon generator. The neck height is determined by the position of boundary between the narrow portion and the wide portion. Thus, it is of importance to control the position of boundary between the narrow portion and the wide portion. According to the conventional manufacturing method for a plasmon generator, however, it is difficult to accurately control the position of boundary between the narrow portion and the wide portion.

U.S. Pat. No. 9,472,230 B1 discloses a plasmon generator including a main body and a front protrusion protruding from the main body, and a manufacturing method for the plasmon generator. In the plasmon generator, the main body has first and second inclined surfaces located on opposite sides of the front protrusion in the track width direction. The manufacturing method for the plasmon generator includes the steps of: forming an initial plasmon generator; forming a first mask on the initial plasmon generator, the first mask being intended for defining the width of the front protrusion; forming a second mask on the initial plasmon generator and the first mask, the second mask being intended for defining the location of the first and second inclined surfaces; and etching the initial plasmon generator using the first and second masks.

The manufacturing method for the plasmon generator disclosed in U.S. Pat. No. 9,472,230 B1 uses a photoresist mask as the second mask. The photoresist mask is formed to cover part of the top surface of the initial plasmon generator and part of the first mask protruding upward from the top surface of the initial plasmon generator. The photoresist mask is thus formed on a non-flat surface. This manufacturing method thus has a disadvantage in that the shape of the photoresist mask tends to become deformed.

SUMMARY OF THE INVENTION

It is an object of the present invention to provide a manufacturing method for a plasmon generator including a narrow portion and a wide portion, the manufacturing method enabling accurate control of the position of boundary between the narrow portion and the wide portion.

A plasmon generator manufactured by a manufacturing method of the present invention includes a wide portion, and a narrow portion protruding from the wide portion. The narrow portion has a proximal end which is a boundary with the wide portion, and a near-field light generating surface which is a protruding end. The proximal end is located at a distance from an imaginary plane including the near-field light generating surface. The wide portion is greater than the narrow portion in maximum width in a first direction parallel to the imaginary plane. The plasmon generator is configured to excite a surface plasmon from light on the wide portion, and to generate near-field light from the surface plasmon at the near-field light generating surface.

The manufacturing method for the plasmon generator of the present invention includes the steps of: forming an initial plasmon generator; forming an etching mask on the initial plasmon generator, the etching mask including a first mask layer for defining the shape of one of the narrow portion and the wide portion and a second mask layer for defining the shape of the other of the narrow portion and the wide portion; and etching the initial plasmon generator into the plasmon generator by using the etching mask.

The step of forming the etching mask includes the steps of: forming a first initial mask layer; forming a first initial hard mask on the first initial mask layer; forming a first resist mask on the first initial hard mask by photolithography, the first resist mask being intended for defining the shape of the first mask layer; etching the first initial hard mask into a first hard mask by using the first resist mask; forming a second initial mask layer on the first initial mask layer and the first hard mask; forming a second initial hard mask on the second initial mask layer; forming a second resist mask on the second initial hard mask by photolithography, the second resist mask being intended for defining the shape of the second mask layer; etching the second initial hard mask into a second hard mask by using the second resist mask; and etching the first and second initial mask layers into the first and second mask layers, respectively, by using the first and second hard masks.

In the manufacturing method of the present invention, the first initial mask layer may include a first carbon layer. The second initial mask layer may be a second carbon layer. The first initial mask layer may include an etching stopper layer, and a layer to be etched which is formed on the etching stopper layer. In such a case, the step of etching the first and second initial mask layers may etch the layer to be etched and the second initial mask layer until the etching stopper layer is exposed.

In the manufacturing method of the present invention, the step of etching the first initial hard mask may be performed by employing reactive ion etching or ion beam etching.

In the manufacturing method of the present invention, the step of etching the second initial hard mask may be performed by employing reactive ion etching or ion beam etching.

In the manufacturing method of the present invention, the step of etching the first and second initial mask layers may be performed by employing reactive ion etching.

In the manufacturing method of the present invention, the step of etching the initial plasmon generator may be performed by employing ion beam etching.

In the manufacturing method of the present invention, the wide portion may have a first end face portion and a second end face portion located with the proximal end of the narrow portion therebetween. The first and second end face portions are parallel to the imaginary plane.

In the manufacturing method of the present invention, the narrow portion may have a first side surface and a second side surface which are perpendicular to the first direction.

The manufacturing method for the plasmon generator of the present invention enables accurate formation of each of the first mask layer and the second mask layer of the etching mask. The present invention thus enables accurate control of the position of boundary between the narrow portion and the wide portion of the plasmon generator.

Other and further objects, features and advantages of the present invention will appear more fully from the following description.

DETAILED DESCRIPTION OF THE PREFERRED EMBODIMENTS

First Embodiment

Figure 3:
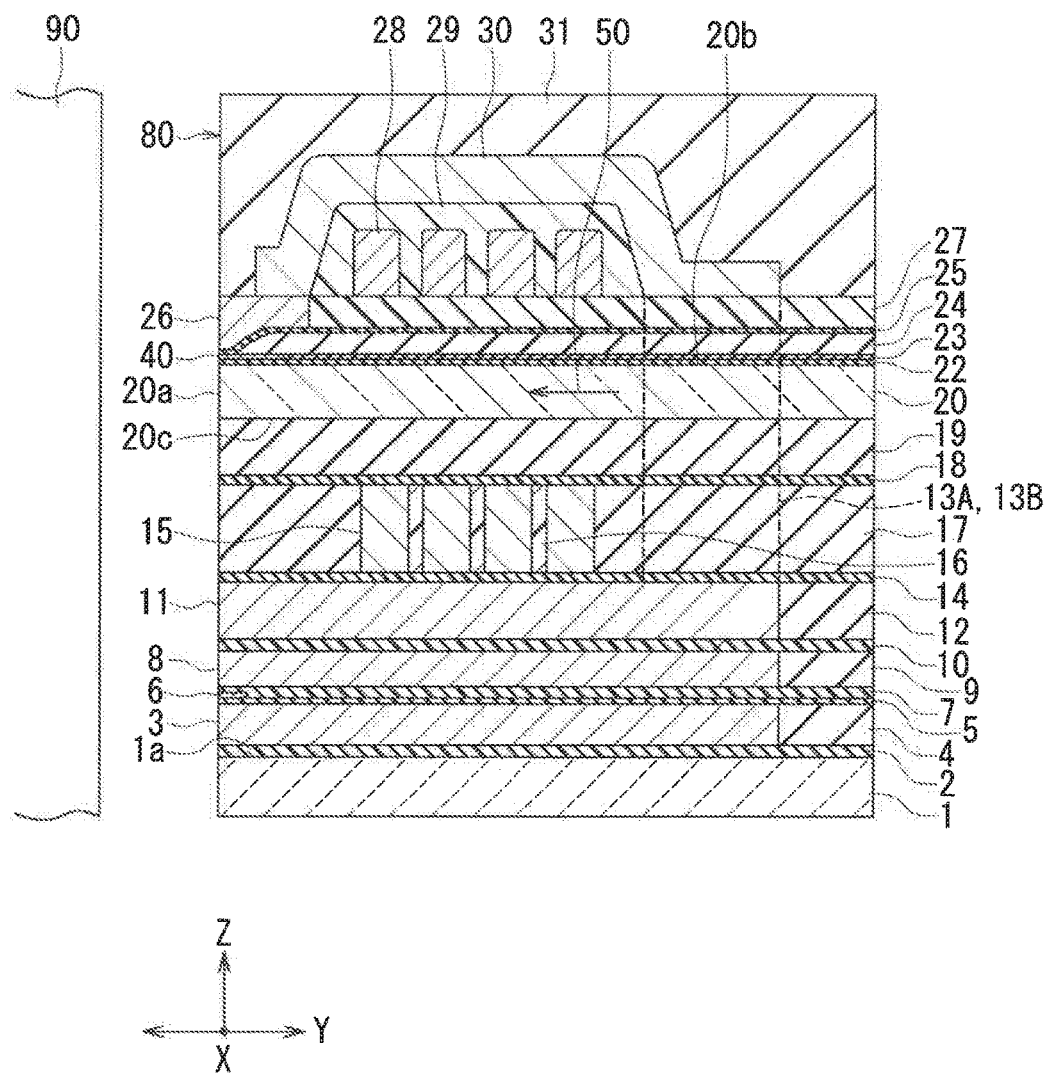
FIG. 3 is a cross-sectional view showing the configuration of a thermally-assisted magnetic recording head of the first embodiment of the invention.
Figure 4:
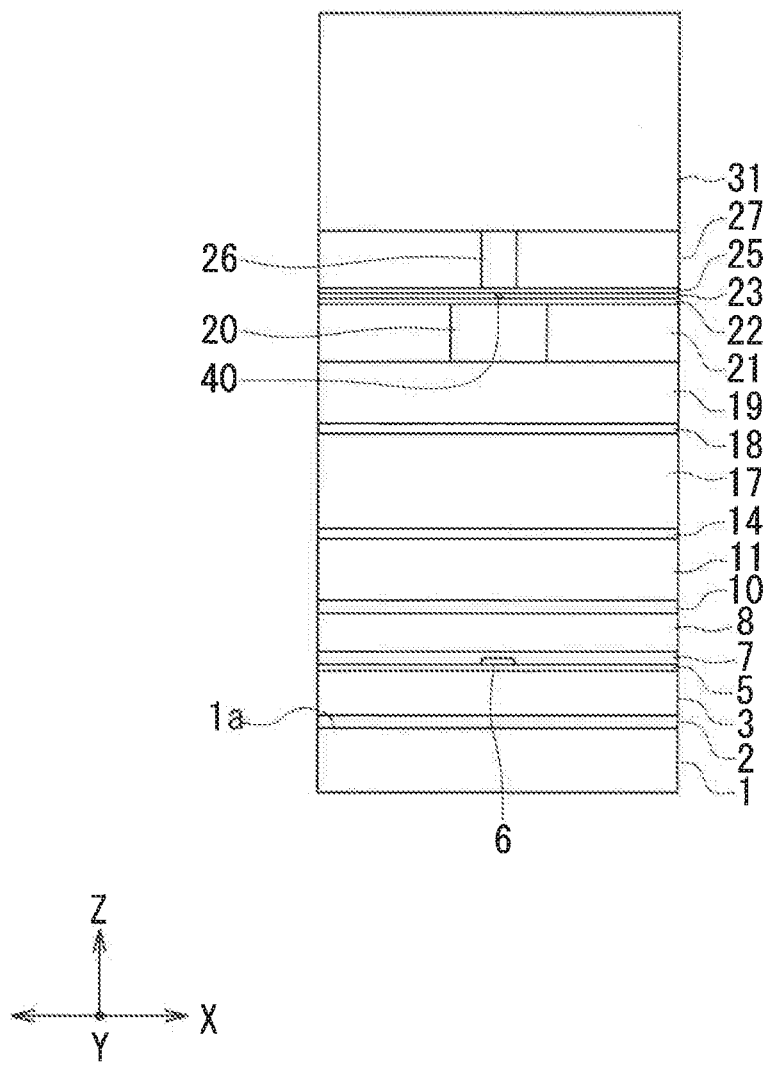
FIG. 4 is a front view showing the medium facing surface of the thermally-assisted magnetic recording head of the first embodiment of the first invention.

Preferred embodiments of the present invention will now be described in detail with reference to the drawings. First, reference is made to FIG. 3 and FIG. 4 to describe the configuration of a thermally-assisted magnetic recording head of a first embodiment of the invention. FIG. 3 is a cross-sectional view showing the configuration of the thermally-assisted magnetic recording head. FIG. 4 is a front view showing the medium facing surface of the thermally-assisted magnetic recording head.

The thermally-assisted magnetic recording head of the present embodiment is intended for perpendicular magnetic recording, and is incorporated in a slider configured to fly over the surface of a rotating recording medium 90. The slider has a medium facing surface 80 configured to face a recording medium 90. When the recording medium 90 rotates, an airflow passing between the recording medium 90 and the slider causes a lift to be exerted on the slider. The lift causes the slider to fly over the surface of the recording medium 90.

As shown in FIG. 3, the thermally-assisted magnetic recording head has the medium facing surface 80. Here, we define X direction, Y direction, and Z direction as follows. The X direction is the direction across the tracks of the recording medium 90, i.e., the track width direction. The Y direction is a direction perpendicular to the medium facing surface 80. The Z direction is the direction of travel of the recording medium 90 as viewed from the slider. The X, Y, and Z directions are orthogonal to one another.

As shown in FIG. 3 and FIG. 4, the thermally-assisted magnetic recording head includes: a substrate 1 formed of a ceramic material such as aluminum oxide-titanium carbide ($Al_2O_3$—TiC) and having a top surface 1a; an insulating layer 2 formed of an insulating material and lying on the top surface 1a of the substrate 1; a bottom shield layer 3 formed of a magnetic material and lying on the insulating layer 2; and an insulating layer 4 lying on the insulating layer 2 and surrounding the bottom shield layer 3. The insulating layers 2 and 4 are formed of alumina ($Al_2O_3$), for example. The Z direction is also a direction perpendicular to the top surface 1a of the substrate 1.

The thermally-assisted magnetic recording head further includes: a bottom shield gap film 5 which is an insulating film lying on the top surfaces of the bottom shield layer 3 and the insulating layer 4; a magnetoresistive (MR) element 6 serving as a read element lying on the bottom shield gap film 5; two leads (not illustrated) connected to the MR element 6; and a top shield gap film 7 which is an insulating film disposed on the MR element 6.

An end of the MR element 6 is located in the medium facing surface 80. The MR element 6 may be an element formed of a magneto-sensitive film that exhibits a magnetoresistive effect, such as an anisotropic magnetoresistive (AMR) element, a giant magnetoresistive (GMR) element, or a tunneling magnetoresistive (TMR) element. The GMR element may be of either the current-in-plane (CIP) type in which a current used for detecting magnetic signals is fed in a direction generally parallel to the planes of layers constituting the GMR element or the current-perpendicular-to-plane (CPP) type in which the current used for detecting magnetic signals is fed in a direction generally perpendicular to the planes of layers constituting the GMR element.

The thermally-assisted magnetic recording head further includes a top shield layer 8 formed of a magnetic material and lying on the top shield gap film 7, and an insulating layer 9 lying on the top shield gap film 7 and surrounding the top shield layer 8. The insulating layer 9 is formed of alumina, for example. The parts from the bottom shield layer 3 to the top shield layer 8 constitute a read head unit.

The thermally-assisted magnetic recording head further includes a nonmagnetic layer 10 formed of a nonmagnetic material and lying on the top shield layer 8 and the insulating layer 9, and a write head unit lying on the nonmagnetic layer 10. The nonmagnetic layer 10 is formed of alumina, for example.

The write head unit includes a return pole layer 11 formed of a magnetic material and lying on the nonmagnetic layer 10, and an insulating layer 12 lying on the nonmagnetic layer 10 and surrounding the return pole layer 11. The insulating layer 12 is formed of alumina, for example.

The write head unit further includes two coupling sections 13A and 13B located away from the medium facing surface 80 and lying on a part of the return pole layer 11, an insulating layer 14 lying on another part of the return pole layer 11 and on the insulating layer 12, and a coil 15 lying on the insulating layer 14. The coupling sections 13A and 13B are formed of a magnetic material. Each of the coupling sections 13A and 13B includes a first layer lying on the return pole layer 11, and a second, a third, and a fourth layer stacked in this order on the first layer. The first layer of the coupling section 13A and the first layer of the coupling section 13B are arranged to be adjacent in the track width direction (the X direction). The coil 15 is wound around the first layers of the coupling sections 13A and 13B. The coil 15 is formed of a conductive material such as copper. The insulating layer 14 is formed of alumina, for example.

The write head unit further includes: an insulating layer 16 located in the space between every adjacent turns of the coil 15; an insulating layer 17 around the coil 15; and an insulating layer 18 on the coil 15 and the insulating layers 16 and 17. The insulating layer 16 is formed of photoresist, for example. The insulating layers 17 and 18 are formed of alumina, for example. The first layers of the coupling sections 13A and 13B are embedded in the insulating layers 14 and 17.

The write head unit further includes a waveguide including a core 20 and a cladding, the core 20 allowing light to propagate therethrough, the cladding being provided around the core 20. As shown in FIG. 3 in particular, the core 20 has a front end face 20a facing toward the medium facing surface 80, an evanescent light generating surface 20b which is a top surface, a bottom surface 20c, and two side surfaces.

The cladding includes cladding layers 19, 21 and 22. The cladding layer 19 lies on the insulating layer 18. The core 20 lies on the cladding layer 19. The cladding layer 21 lies on the cladding layer 19 and surrounds the core 20. The cladding layer 22 is disposed over the evanescent light generating surface 20b of the core 20 and the top surface of the cladding layer 21.

The core 20 is formed of a dielectric material that transmits laser light to be used for generating near-field light. The laser light emitted from a non-illustrated laser diode enters the core 20 and propagates through the core 20. The cladding layers 19, 21 and 22 are each formed of a dielectric material that has a refractive index lower than that of the core 20. For example, the core 20 may be formed of tantalum oxide such as $Ta_2O_5$ or silicon oxynitride (SiON), whereas the cladding layers 19, 21 and 22 may be formed of silicon oxide ($SiO_2$) or alumina.

The second layers of the coupling sections 13A and 13B are embedded in the insulating layer 18 and the cladding layer 19. The third layers of the coupling sections 13A and 13B are embedded in the cladding layer 21. The third layer of the coupling section 13A and the third layer of the coupling section 13B are located on opposite sides of the core 20 in the track width direction (the X direction), each being at a distance from the core 20.

The write head unit further includes a plasmon generator 40 according to the present embodiment. The plasmon generator 40 lies on the cladding layer 22 in the vicinity of the medium facing surface 80. The plasmon generator 40 is configured to excite surface plasmons on the principle to be described later. The plasmon generator 40 is formed of, for example, one of Au, Ag, Al, Cu, Pd, Pt, Rh and Ir, or an alloy composed of two or more of these elements. The shape of the plasmon generator 40 will be described in detail later.

The write head unit further includes a dielectric layer 23 lying on the cladding layer 22 and surrounding the plasmon generator 40, a dielectric layer 24 disposed to cover the dielectric layer 23 and part of the plasmon generator 40, and a dielectric layer 25 lying on the plasmon generator 40 and the dielectric layer 24. The dielectric layer 24 has a top surface and an end face closest to the medium facing surface 80. The distance from the medium facing surface 80 to any point on the aforementioned end face of the dielectric layer 24 decreases with decreasing distance from the point to the top surface 1a of the substrate 1. The dielectric layers 23 to 25 are formed of alumina, for example.

The write head unit further includes a main pole 26 formed of a magnetic material. The main pole 26 is disposed on the dielectric layer 25 in such a manner as to ride over the aforementioned end face and part of the top surface of the dielectric layer 24. The plasmon generator 40 lies between the core 20 and the main pole 26. The main pole 26 has an end face located in the medium facing surface 80.

The write head unit further includes a dielectric layer 27 disposed around the main pole 26. The fourth layers of the coupling sections 13A and 13B are embedded in the cladding layer 22 and the dielectric layers 23 to 25 and 27. The top surfaces of the main pole 26, the dielectric layer 27 and the fourth layers of the coupling sections 13A and 13B are even with each other. The dielectric layer 27 is formed of silicon oxide, for example.

The write head unit further includes a coil 28 lying on the dielectric layer 27, an insulating layer 29 disposed to cover the coil 28, and a yoke layer 30 formed of a magnetic material and lying on the main pole 26, the coupling sections 13A and 13B, the dielectric layer 27 and the insulating layer 29. The yoke layer 30 magnetically couples the main pole 26 to the coupling sections 13A and 13B. The coil 28 is wound around portions of the yoke layer 30 that are located on the coupling sections 13A and 13B. The coil 28 is formed of a conductive material such as copper. The insulating layer 29 is formed of photoresist, for example.

The thermally-assisted magnetic recording head further includes a protective layer 31 disposed to cover the write head unit. The protective layer 31 is formed of alumina, for example.

As has been described, the thermally-assisted magnetic recording head of the present embodiment includes the medium facing surface 80, the read head unit, and the write head unit. The read head unit and the write head unit are stacked on the substrate 1. The write head unit is located on the trailing side, i.e., the front side in the direction of travel of the recording medium 90 (the Z direction), relative to the read head unit.

The write head unit includes the coils 15 and 28, the main pole 26, the waveguide, and the plasmon generator 40. The waveguide includes the core 20 and the cladding. The cladding includes the cladding layers 19, 21 and 22.

The write head unit further includes the return pole layer 11, the coupling sections 13A and 13B, and the yoke layer 30. The coils 15 and 28 produce magnetic fields corresponding to data to be written on the recording medium 90. The return pole layer 11, the coupling sections 13A and 13B, the yoke layer 30 and the main pole 26 form a magnetic path for passing magnetic fluxes corresponding to the magnetic fields produced by the coils 15 and 28. The coils 15 and 28 are connected in series or in parallel so that the magnetic flux corresponding to the magnetic field produced by the coil 15 and the magnetic flux corresponding to the magnetic field produced by the coil 28 flow in the same direction through the main pole 26. The main pole 26 passes the magnetic flux corresponding to the magnetic field produced by the coil 15 and the magnetic flux corresponding to the magnetic field produced by the coil 28, and produces a write magnetic field for use to write data on the recording medium 90 by means of a perpendicular magnetic recording system.

Figure 1:
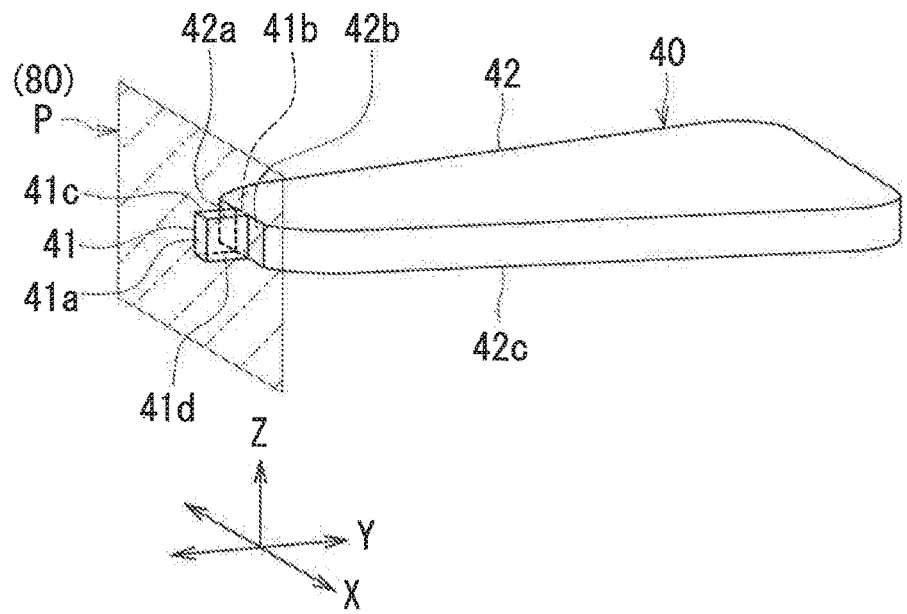
FIG. 1 is a perspective view showing a plasmon generator according to a first embodiment of the invention.
Figure 2:
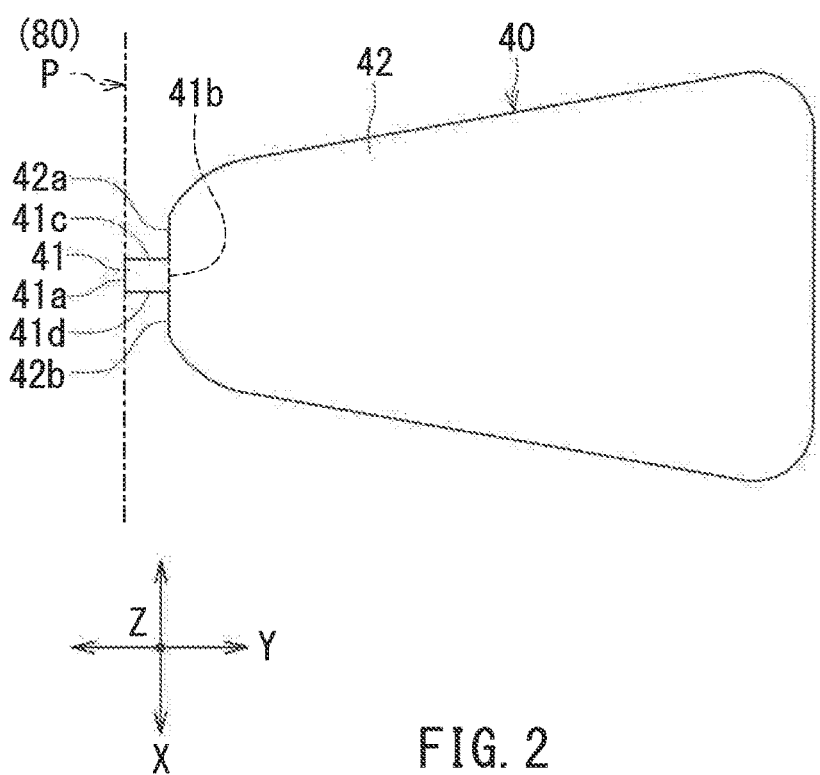
FIG. 2 is a plan view showing the plasmon generator according to the first embodiment of the invention.

The plasmon generator 40 according to the present embodiment will now be described in detail with reference to FIGS. 1 and 2. FIG. 1 is a perspective view showing the plasmon generator 40. FIG. 2 is a plan view showing the plasmon generator 40. FIGS. 1 and 2 also show the X, Y and Z directions mentioned previously.

As shown in FIGS. 1 and 2, the plasmon generator 40 includes a wide portion 42, and a narrow portion 41 protruding from the wide portion 42. The narrow portion 41 has a proximal end 41b which is the boundary with the wide portion 42, and a near-field light generating surface 41a which is a protruding end. The near-field light generating surface 41a is located in the medium facing surface 80. The near-field light generating surface 41a generates near-field light on the principle to be described later.

As shown in FIGS. 1 and 2, let us assume an imaginary plane P including the near-field light generating surface 41a. The imaginary plane P is also the XZ plane including the near-field light generating surface 41a. The medium facing surface 80 is included in the imaginary plane P. For example, the plasmon generator 40 is rectangular in cross section parallel to the imaginary plane P. The thickness (the dimension in the Z direction) of the plasmon generator 40 is generally constant regardless of distance from the imaginary plane P.

The proximal end 41b of the narrow portion 41 is located at a distance from the imaginary plane P. In the present embodiment, the narrow portion 41 further has a first side surface 41c and a second side surface 41d located at opposite ends of the narrow portion 41 in the track width direction (the X direction). The first and second side surfaces 41c and 41d may be perpendicular to the X direction. In such a case, the width of the narrow portion 41 in the X direction is constant regardless of distance from the medium facing surface 80. The X direction is parallel to the imaginary plane P, and corresponds to the first direction in the present invention.

The width (the dimension in the X direction or the track width direction) of the near-field light generating surface 41a is defined by the width of the narrow portion 41 in the medium facing surface 80. The width of the near-field light generating surface 41a falls within the range of 5 to 70 nm, for example. The height (the dimension in the Z direction) of the near-field light generating surface 41a is defined by the height of the narrow portion 41 in the medium facing surface 80. The height of the near-field light generating surface 41a falls within the range of 5 to 40 nm, for example.

As shown in FIGS. 1 and 2, the wide portion 42 is greater than the narrow portion 41 in maximum width in the X direction. In the present embodiment, the wide portion 42 has a first end face portion 42a, a second end face portion 42b and a bottom surface 42c, the first and second end face portions 42a and 42b being located with the proximal end 41b of the narrow portion 41 therebetween. The first and second end face portions 42a and 42b are parallel to the imaginary plane P. When the first and second side surfaces 41c and 41d of the narrow portion 41 are perpendicular to the X direction, the angle that the first end face portion 42a forms with the first side surface 41c and the angle that the second end face portion 42b forms with the second side surface 41d are both 90°.

Now, the principle of generation of near-field light in the present embodiment and the principle of thermally-assisted magnetic recording using near-field light will be described in detail. Laser light emitted from a laser diode (not illustrated) enters the core 20. As shown in FIG. 3, the laser light 50 propagates through the core 20 toward the medium facing surface 80, and reaches the vicinity of the plasmon generator 40. The evanescent light generating surface 20b of the core 20 generates evanescent light from the laser light 50 propagating through the core 20. More specifically, the laser light 50 is totally reflected at the evanescent light generating surface 20b, and this causes the evanescent light generating surface 20b to generate evanescent light permeating into the cladding layer 22. In the plasmon generator 40, surface plasmons are excited on the bottom surface 42c of the wide portion 42 through coupling with the aforementioned evanescent light. The excited surface plasmons propagate to the near-field light generating surface 41a of the narrow portion 41, and the near-field light generating surface 41a of the narrow portion 41 generates near-field light from those surface plasmons.

The near-field light generated at the near-field light generating surface 41a is projected toward the recording medium 90, reaches the surface of the recording medium 90 and heats a portion of the magnetic recording layer of the recording medium 90. This lowers the coercivity of the portion of the magnetic recording layer. In thermally-assisted magnetic recording, the portion of the magnetic recording layer with the lowered coercivity is subjected to a write magnetic field produced by the main pole 26 for data writing.

A manufacturing method for the thermally-assisted magnetic recording head of the present embodiment will now be described with reference to FIGS. 3 and 4. The manufacturing method for the thermally-assisted magnetic recording head includes the steps of: forming components of a plurality of thermally-assisted magnetic recording heads, except the substrates 1, on a wafer that includes portions to become the substrates 1 of the thermally-assisted magnetic recording heads, thereby fabricating a substructure including a plurality of pre-head portions arranged in rows, the plurality of pre-head portions becoming individual thermally-assisted magnetic recording heads later; and cutting the substructure to separate the plurality of pre-head portions from each other and forming the medium facing surface 80 for each of the plurality of pre-head portions (this step will be referred to as the step of forming the medium facing surface 80). A plurality of thermally-assisted magnetic recording heads are produced in this manner.

The manufacturing method for the thermally-assisted magnetic recording head of the present embodiment will be described in more detail below with attention focused on a single thermally-assisted magnetic recording head. In the manufacturing method for the thermally-assisted magnetic recording head, first, the insulating layer 2 is formed on the substrate 1. The bottom shield layer 3 is then formed on the insulating layer 2. Then, the insulating layer 4 is formed to cover the bottom shield layer 3. The insulating layer 4 is then polished by, for example, chemical mechanical polishing (hereinafter referred to as CMP), until the bottom shield layer 3 is exposed.

Then, the bottom shield gap film 5 is formed over the bottom shield layer 3 and the insulating layer 4. On the bottom shield gap film 5, the MR element 6 and two leads (not illustrated) connected to the MR element 6 are then formed. Then, the top shield gap film 7 is formed to cover the MR element 6 and the leads. The top shield layer 8 is then formed on the top shield gap film 7. Then, the insulating layer 9 is formed to cover the top shield layer 8. The insulating layer 9 is then polished by, for example, CMP, until the top shield layer 8 is exposed.

Then, the nonmagnetic layer 10 is formed over the top shield layer 8 and the insulating layer 9. The return pole layer 11 is then formed on the nonmagnetic layer 10. Then, the insulating layer 12 is formed to cover the return pole layer 11. The insulating layer 12 is then polished by, for example, CMP, until the return pole layer 11 is exposed. Then, the insulating layer 14 is formed over the return pole layer 11 and the insulating layer 12.

The insulating layer 14 is then selectively etched to form therein two openings for exposing the top surface of the return pole layer 11. Then, the first layers of the coupling sections 13A and 13B are formed on the return pole layer 11 at the positions of the two openings. The coil 15 is then formed on the insulating layer 14. The insulating layer 16 is then formed in the space between every adjacent turns of the coil 15. Then, the insulating layer 17 is formed over the entire top surface of the stack. The insulating layer 17 is then polished by, for example, CMP, until the first layers of the coupling sections 13A and 13B, the coil 15, and the insulating layer 16 are exposed. The insulating layer 18 is then formed over the first layers of the coupling sections 13A and 13B, the coil 15, and the insulating layers 16 and 17.

The insulating layer 18 is then selectively etched to form therein two openings for exposing the top surfaces of the first layers of the coupling sections 13A and 13B. The second layers of the coupling sections 13A and 13B are then formed on the first layers of the coupling sections 13A and 13B. Then, the cladding layer 19 is formed to cover the second layers of the coupling sections 13A and 13B. The cladding layer 19 is then polished by, for example, CMP, until the second layers of the coupling sections 13A and 13B are exposed. The third layers of the coupling sections 13A and 13B are then formed on the second layers of the coupling sections 13A and 13B.

Then, the core 20 is formed on the cladding layer 19. The cladding layer 21 is then formed over the entire top surface of the stack. The cladding layer 21 is then polished by, for example, CMP, until the core 20 and the third layers of the coupling sections 13A and 13B are exposed. Then, the cladding layer 22 is formed over the entire top surface of the stack. The plasmon generator 40 is then formed on the cladding layer 22. The step of forming the plasmon generator 40 will be described in detail later.

Next, the dielectric layer 23 is formed to cover the plasmon generator 40. The dielectric layer 23 is then polished by, for example, CMP, until the plasmon generator 40 is exposed. Then, the dielectric layer 24 is formed on the dielectric layer 23 and part of the plasmon generator 40. The dielectric layer 25 is then formed on the plasmon generator 40 and the dielectric layer 24. The cladding layer 22 and the dielectric layers 23 to 25 are then selectively etched to form therein openings for exposing the top surfaces of the third layers of the coupling sections 13A and 13B. Then, the main pole 26 is formed on the dielectric layer 25, and the fourth layers of the coupling sections 13A and 13B are formed on the third layers of the coupling sections 13A and 13B. The dielectric layer 27 is then formed to cover the main pole 26 and the fourth layers of the coupling sections 13A and 13B. The dielectric layer 27 is then polished by, for example, CMP, until the main pole 26 and the fourth layers of the coupling sections 13A and 13B are exposed.

Next, the coil 28 is formed on the dielectric layer 27. Then, the insulating layer 29 is formed to cover the coil 28. The yoke layer 30 is then formed over the main pole 26, the fourth layers of the coupling sections 13A and 13B, the dielectric layer 27 and the insulating layer 29. The protective layer 31 is then formed to cover the yoke layer 30. Wiring, terminals, and other components are then formed on the top surface of the protective layer 31. When the substructure is completed thus, the step of forming the medium facing surface 80 is performed. A protective film for covering the medium facing surface 80 may be formed thereafter. Being provided with the medium facing surface 80, each pre-head portion becomes a thermally-assisted magnetic recording head.

The step of forming the medium facing surface 80 includes the step of polishing the surface of each pre-head portion that has resulted from cutting the substructure, and the step of forming a rail on the polished surface for allowing the slider to fly.

The step of forming the plasmon generator 40 will now be described. The following descriptions include descriptions of the manufacturing method for the plasmon generator 40 according to the present embodiment. The step of forming the plasmon generator 40 includes the steps of: forming an initial plasmon generator; forming an etching mask on the initial plasmon generator; and etching the initial plasmon generator into the plasmon generator 40 by using the etching mask. The etching mask includes a first mask layer for defining the shape of one of the narrow portion 41 and the wide portion 42, and a second mask layer for defining the shape of the other of the narrow portion 41 and the wide portion 42. For the present embodiment, descriptions will be given of the case where the first mask layer defines the shape of the narrow portion 41 and the second mask layer defines the shape of the wide portion 42.

Reference is now made to FIGS. 5A to 12C to describe the step of forming the plasmon generator 40 in detail. FIGS. 5A to 12C each show a stack of layers formed in the process of manufacturing the thermally-assisted magnetic recording head. Fig. nA (n is an integer between 5 and 12 inclusive) shows a cross section of the stack taken at the location at which the medium facing surface 80 is to be formed. Fig. nB shows a cross section that intersects the end face of the main pole 26 and that is perpendicular to the medium facing surface 80 and to the top surface 1a of the substrate 1. Fig. nC shows the top surface of part of the stack. Figs. nA and nB, excluding FIGS. 12A and 12B, omit the illustration of portions that are located on the substrate-1 side relative to the initial plasmon generator. FIGS. 12A and 12B omit the illustration of portions that are located on the substrate-1 side relative to the cladding layer 22. FIG. 11D is a perspective view of part of the stack.

Figure 5A:
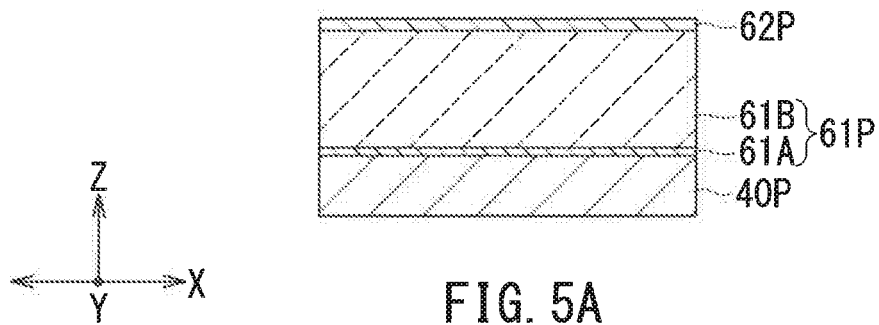
FIGS. 5A to 5C are explanatory diagrams showing a step of a manufacturing method for the plasmon generator according to the first embodiment of the invention.
Figure 5B:
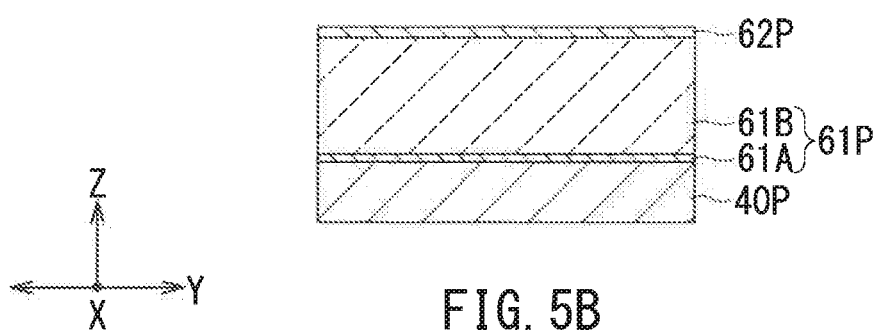
Figure 5C:
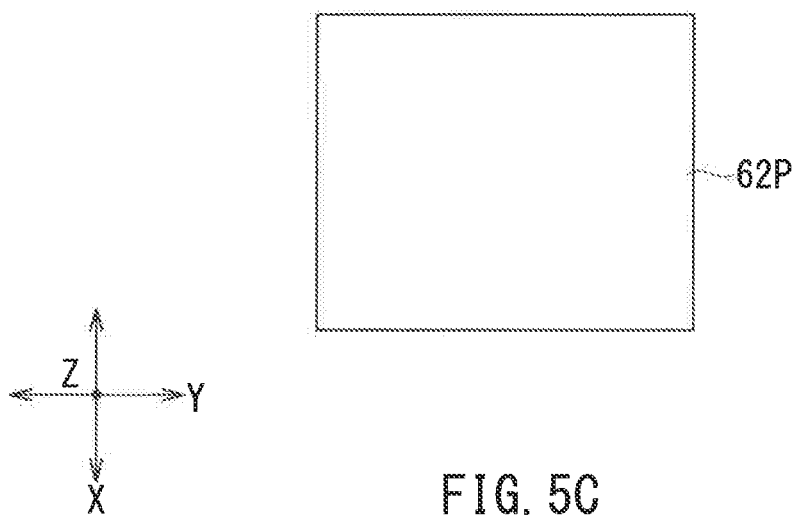

FIGS. 5A to 5C show a step following the formation of the cladding layer 22. In this step, first, the initial plasmon generator 40P is formed on the cladding layer 22. Then, a first initial mask layer 61P is formed on the initial plasmon generator 40P. Then, a first initial hard mask 62P is formed on the first initial mask layer 61P.

The first initial mask layer 61P may include an etching stopper layer 61A, and a layer to be etched 61B formed on the etching stopper layer 61A. Now, a description will be given of requirements pertaining to the materials of the etching stopper layer 61A, the layer to be etched 61B and the first initial hard mask 62P and etching conditions for each of the step of completing the etching mask and the step of etching the first initial hard mask 62P to be described later.

The step of completing the etching mask is performed by employing reactive ion etching (hereinafter referred to as RIE). What is required for this step is to select a combination of materials of the etching stopper layer 61A, the layer to be etched 61B and the first initial hard mask 62P and etching conditions so as to achieve a sufficiently higher etching rate for the layer to be etched 61B than for the etching stopper layer 61B and the first initial hard mask 62P. Such a requirement will be referred to as the first requirement.

The step of etching the first initial hard mask 62P is performed by employing RIE or ion beam etching (hereinafter referred to as IBE). What is required in the case of employing RIE for the step of etching the first initial hard mask 62P is to select a combination of materials of the layer to be etched 61B and the first initial hard mask 62P and etching conditions so as to achieve a sufficiently higher etching rate for the first initial hard mask 62P than for the layer to be etched 61B. Such a requirement will be referred to as the second requirement.

The first and second requirements must be met where the step of etching the first initial hard mask 62P is performed by employing RIE. Depending on the etching conditions for each of the step of completing the etching mask and the step of etching the first initial hard mask 62P, examples of combinations of materials meeting the first and second requirements include a combination of carbon as the material of the layer to be etched 61B and Ta, alumina or silicon oxide as the material of the etching stopper layer 61A and the first initial hard mask 62P. The etching conditions for each of the step of completing the etching mask and the step of etching the first initial hard mask 62P will be described later.

Where the step of etching the first initial hard mask 62P is performed by employing IBE, only the first requirement needs to be met. Depending on the etching conditions for the step of completing the etching mask, examples of combinations of materials meeting the first requirement include a combination of carbon, silicon oxide, alumina, tantalum oxide or aluminum alloy as the material of the layer to be etched 61B and Ru, NiFe or NiCr as the material of the etching stopper layer 61A and the first initial hard mask 62P.

Carbon is particularly preferable as the material of the layer to be etched 61B. Hereinafter, the layer to be etched 61B as it is formed of carbon will be referred to as the first carbon layer.

Figure 6A:
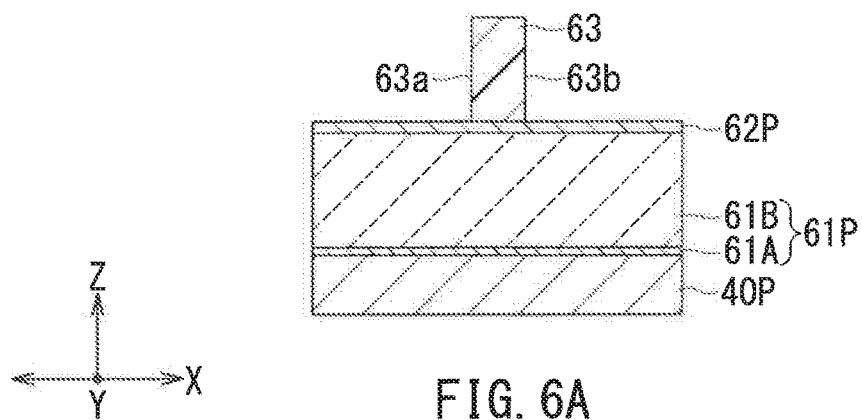
FIGS. 6A to 6C are explanatory diagrams showing a step that follows the step shown in FIGS. 5A to 5C.
Figure 6B:
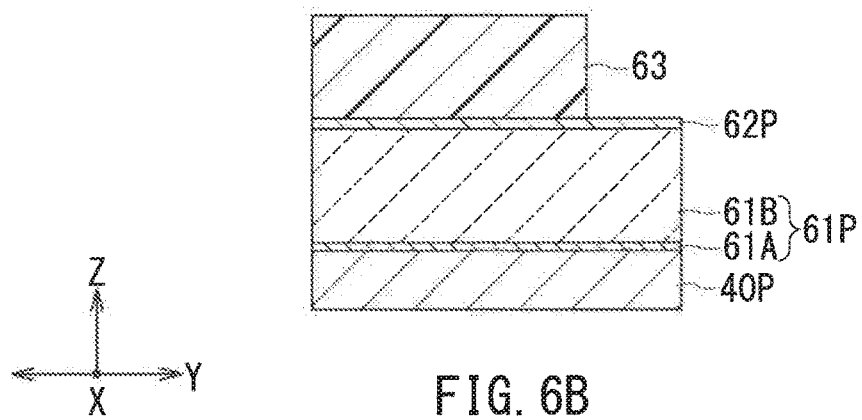
Figure 6C:
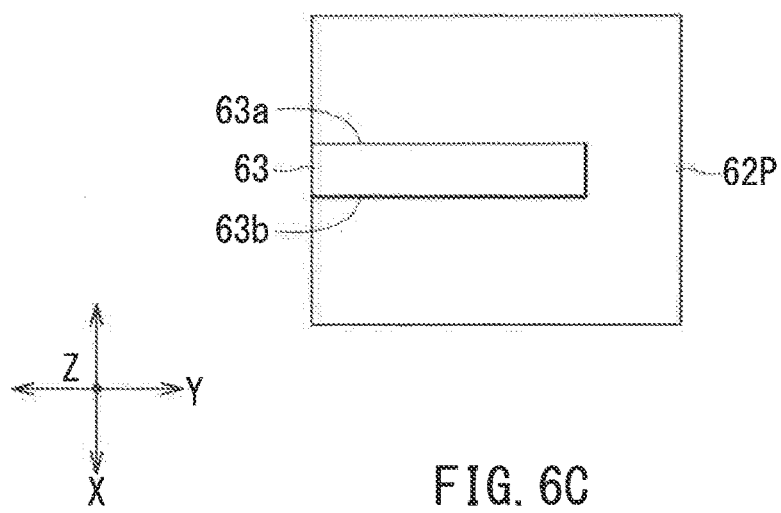

FIGS. 6A to 6C show the next step. In this step, a first resist mask 63 for defining the shape of the first mask layer, i.e., the shape of the narrow portion 41, is formed on the first initial hard mask 62P by photolithography. The planar shape of the first resist mask 63 corresponds to that of the narrow portion 41. The planar shape refers to the shape viewed from above. The first resist mask 63 has a wall face 63a for defining the position of the first side surface 41c of the narrow portion 41 and a wall face 63b for defining the position of the second side surface 41d of the narrow portion 41. The first resist mask 63 does not have any undercut that a resist mask used in a lift-off process would have. The first resist mask 63 is preferably composed of a single layer of photoresist.

Figure 7A:
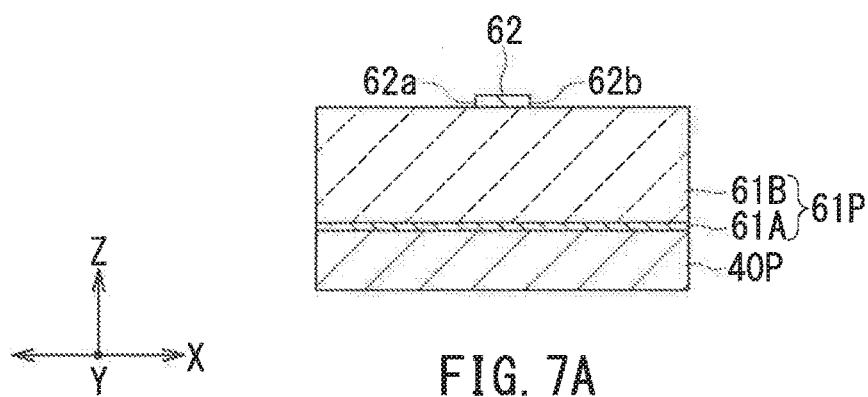
FIGS. 7A to 7C are explanatory diagrams showing a step that follows the step shown in FIGS. 6A to 6C.
Figure 7B:
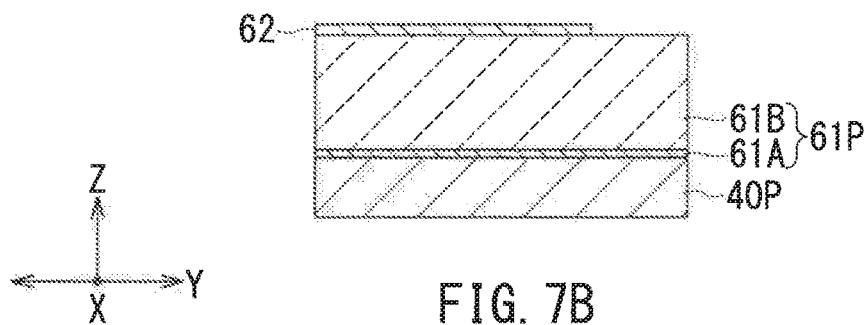
Figure 7C:
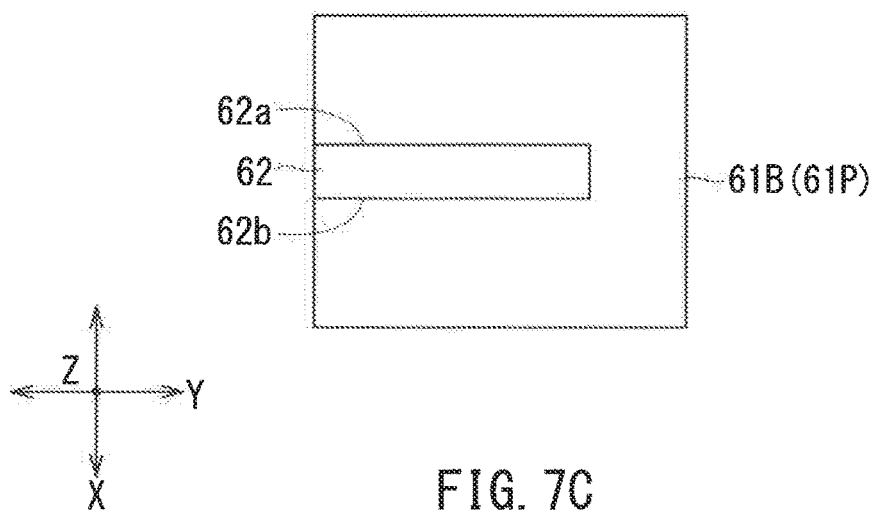

FIGS. 7A to 7C show the next step. In this step, first, the first initial hard mask 62P is etched into a first hard mask 62 by using the first resist mask 63. The first hard mask 62 is provided with an end 62a whose position is defined by the wall face 63a of the first resist mask 63, and an end 62b whose position is defined by the wall face 63b of the first resist mask 63. The first resist mask 63 is then removed.

As mentioned above, the step of etching the first initial hard mask 62P is performed by employing RIE or IBE. In the case of employing the aforementioned example of combinations of materials meeting the first and second requirements, an example of etching conditions for the step of etching the first initial hard mask 62P is the use of a gas containing $Cl_2$ and $BCl_3$ or a gas containing $CF_4$ as the etching gas.

Figure 8A:
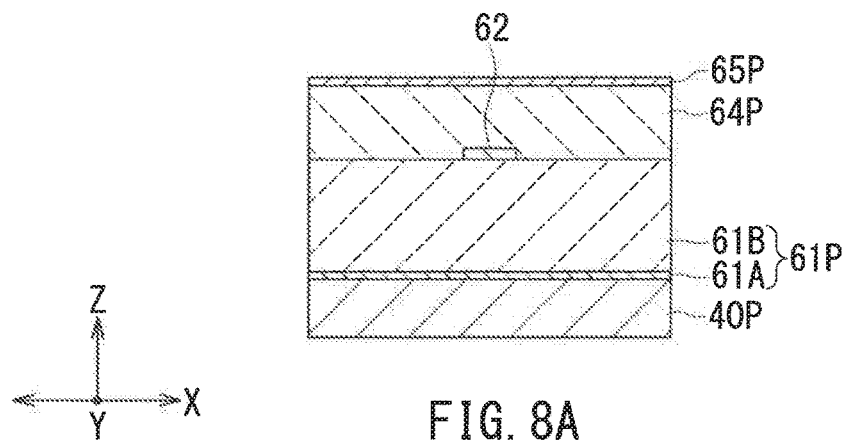
FIGS. 8A to 8C are explanatory diagrams showing a step that follows the step shown in FIGS. 7A to 7C.
Figure 8B:
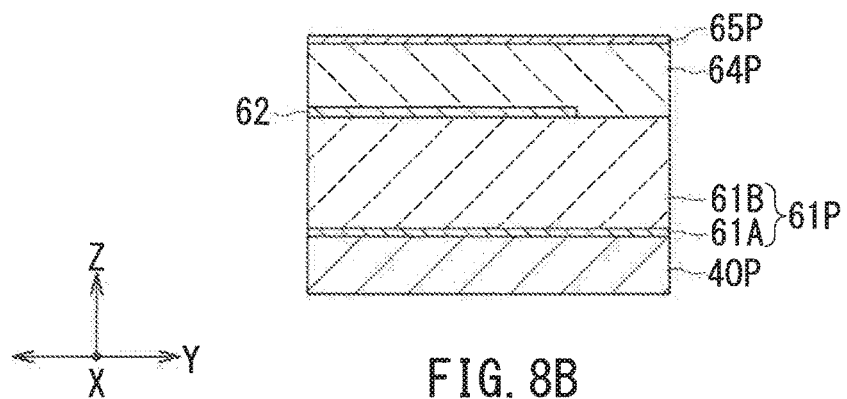
Figure 8C:
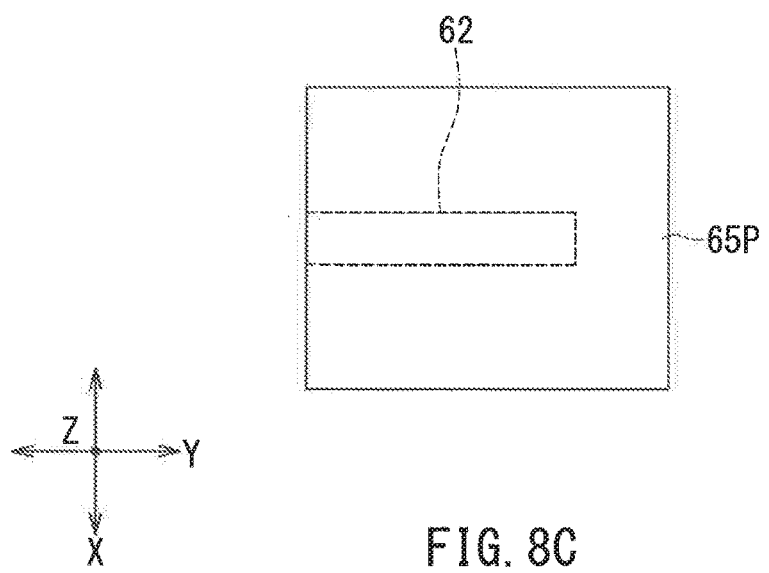

FIGS. 8A to 8C show the next step. In this step, first, a second initial mask layer 64P is formed on the first initial mask layer 61P and the first hard mask 62. Then, a second initial hard mask 65P is formed on the second initial mask layer 64P.

Now, a description will be given of requirements pertaining to the materials of the second initial mask layer 64P and the second initial hard mask 65P and etching conditions for each of the step of completing the etching mask and the step of etching the second initial hard mask 65P to be described later.

What is required for the step of completing the etching mask is to select a combination of materials of the second initial mask layer 64P and the second initial hard mask 65P and etching conditions so as to achieve a sufficiently higher etching rate for the second initial mask layer 64P than for the second initial hard mask 65P. Such a requirement will be referred to as the third requirement.

The step of etching the second initial hard mask 65P is performed by employing RIE or IBE, as is the step of etching the first initial hard mask 62P. What is required in the case of employing RIE for the step of etching the second initial hard mask 65P is to select a combination of materials of the second initial mask layer 64P and the second initial hard mask 65P and etching conditions so as to achieve a sufficiently higher etching rate for the second initial hard mask 65P than for the second initial mask layer 64P. Such a requirement will be referred to as the fourth requirement.

The third and fourth requirements must be met where the step of etching the second initial hard mask 65P is performed by employing RIE. Depending on the etching conditions for each of the step of completing the etching mask and the step of etching the second initial hard mask 65P, examples of combinations of materials meeting the third and fourth requirements include a combination of carbon as the material of the second initial mask layer 64P and Ta, alumina or silicon oxide as the material of the second initial hard mask 65P. The etching conditions for each of the step of completing the etching mask and the step of etching the second initial hard mask 65P will be described later.

Where the step of etching the second initial hard mask 65P is performed by employing IBE, only the third requirement needs to be met. Depending on the etching conditions for the step of completing the etching mask, examples of combinations of materials meeting the third requirement include a combination of carbon, silicon oxide, alumina, tantalum oxide or aluminum alloy as the material of the second initial mask layer 64P and Ru, NiFe or NiCr as the material of the second initial hard mask 65P.

Carbon is particularly preferable as the material of the second initial mask layer 64P. Hereinafter, the second initial mask layer 64P as it is formed of carbon will be referred to as the second carbon layer.

Figure 9A:
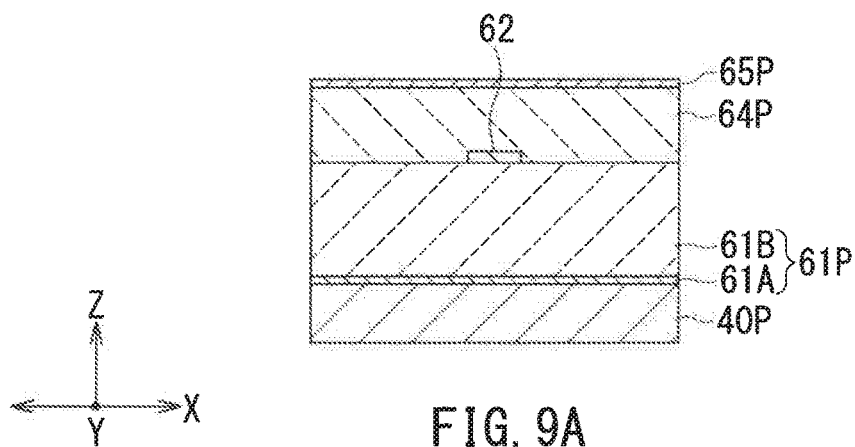
FIGS. 9A to 9C are explanatory diagrams showing a step that follows the step shown in FIGS. 8A to 8C.
Figure 9B:
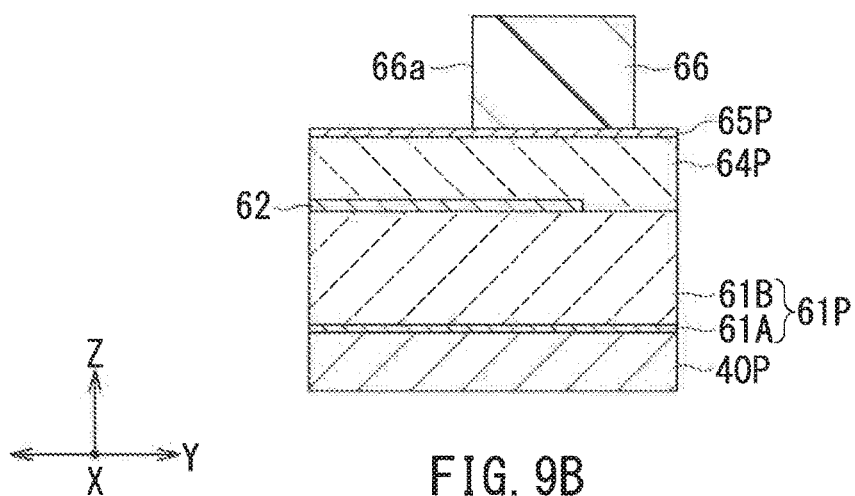
Figure 9C:
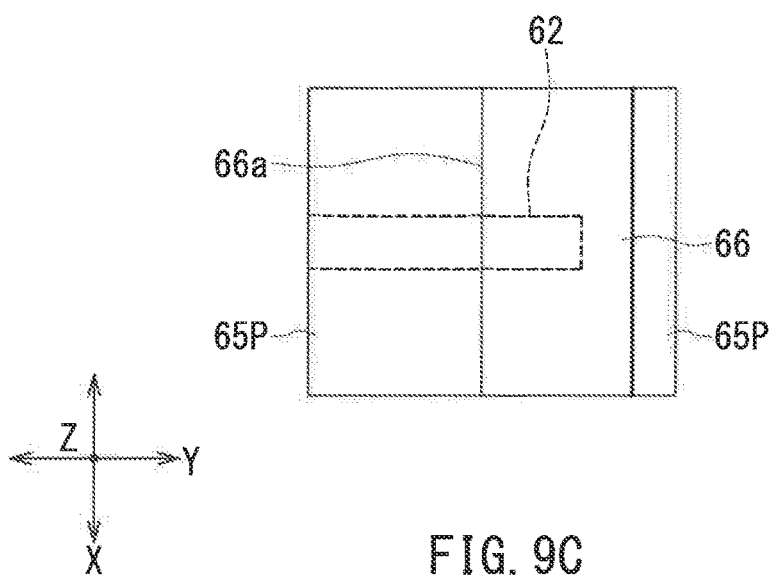

FIGS. 9A to 9C show the next step. In this step, a second resist mask 66 for defining the shape of the second mask layer, i.e., the shape of the wide portion 42, is formed on the second initial hard mask 65P by photolithography. The planar shape of the second resist mask 66 corresponds to that of the wide portion 42. The second resist mask 66 has a wall face 66a for defining the position of the first and second end face portions 42a and 42b of the wide portion 42. The second resist mask 66 does not have any undercut that a resist mask used in a lift-off process would have. The second resist mask 66 is preferably composed of a single layer of photoresist.

The shape of the second resist mask 66 is depicted in a simplified manner in FIGS. 9B and 9C. In other figures illustrating steps subsequent to this step, the shape of any portion defined by the second resist mask 66 is also depicted in a simplified manner.

Figure 10A:
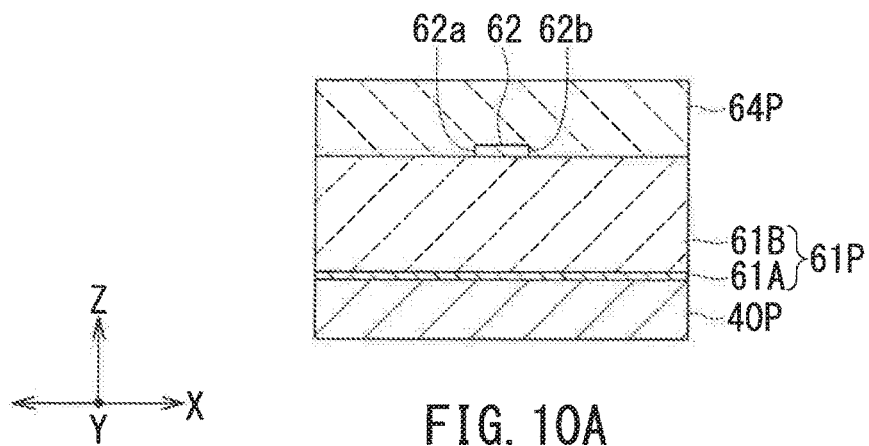
FIGS. 10A to 10C are explanatory diagrams showing a step that follows the step shown in FIGS. 9A to 9C.
Figure 10B:
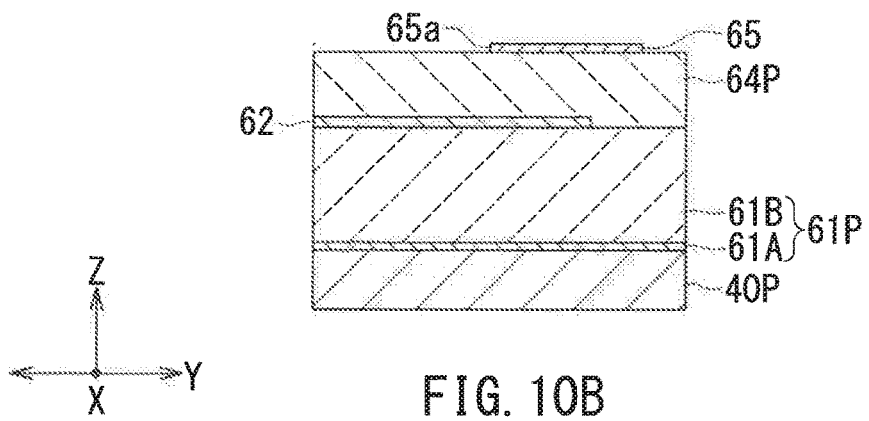
Figure 10C:
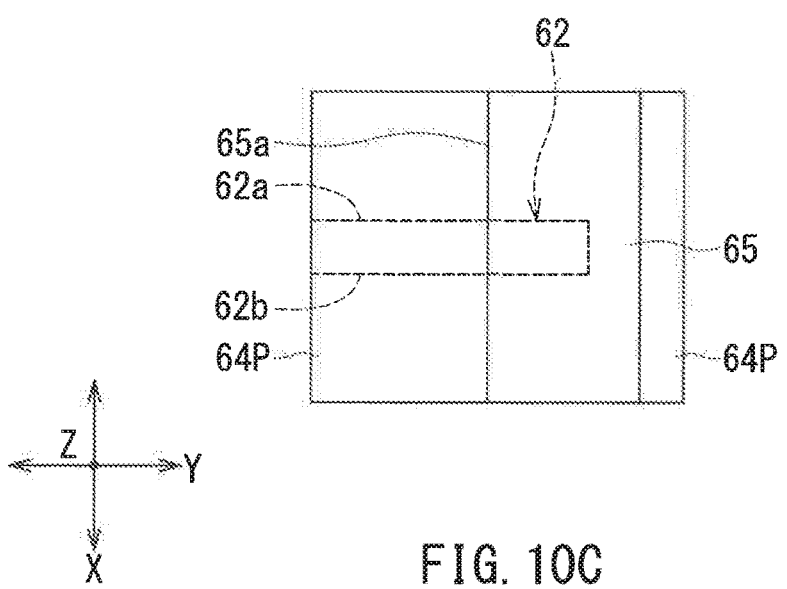

FIGS. 10A to 10C show the next step. In this step, first, the second initial hard mask 65P is etched into a second hard mask 65 by using the second resist mask 66. The second hard mask 65 is provided with an end 65a whose position is defined by the wall face 66a of the second resist mask 66.

The end 65a is located to intersect the ends 62a and 62b of the first hard mask 62 as viewed from above. The second resist mask 66 is then removed.

As previously mentioned, the step of etching the second initial hard mask 65P is performed by employing RIE or IBE. In the case of employing the aforementioned example of combinations of materials meeting the third and fourth requirements, an example of the etching conditions for the step of etching the second initial hard mask 65P is the use of a gas containing $Cl_2$ and $BCl_3$ or a gas containing $CF_4$ as the etching gas.

Figure 11A:
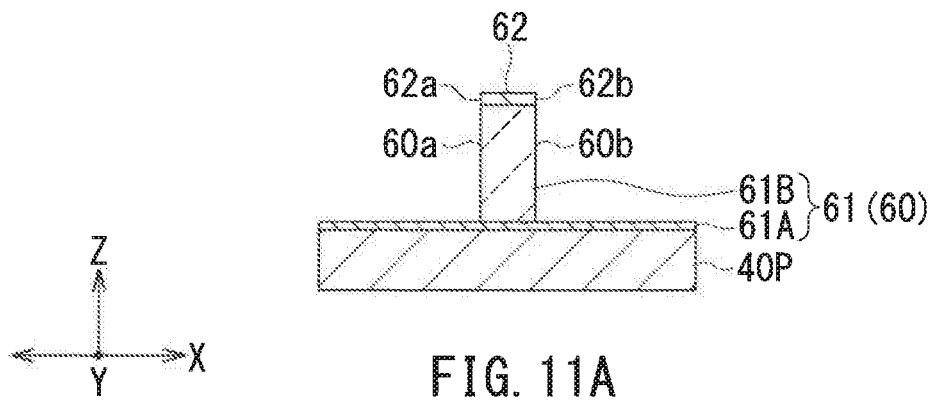
FIGS. 11A to 11D are explanatory diagrams showing a step that follows the step shown in FIGS. 10A to 10C.
Figure 11B:
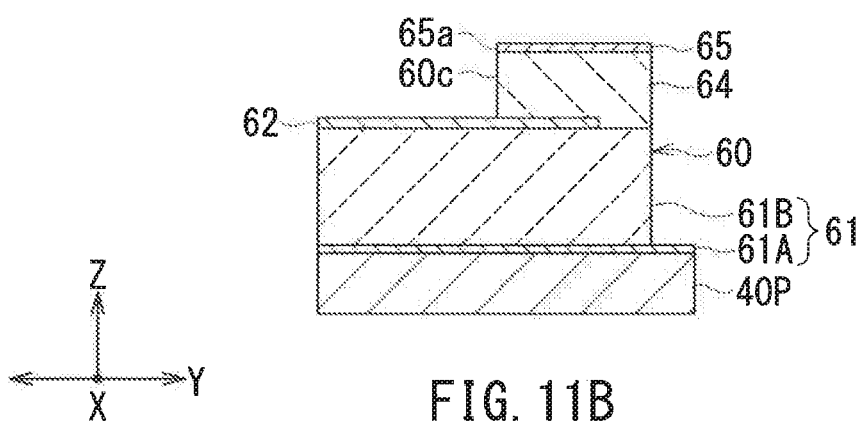
Figure 11C:
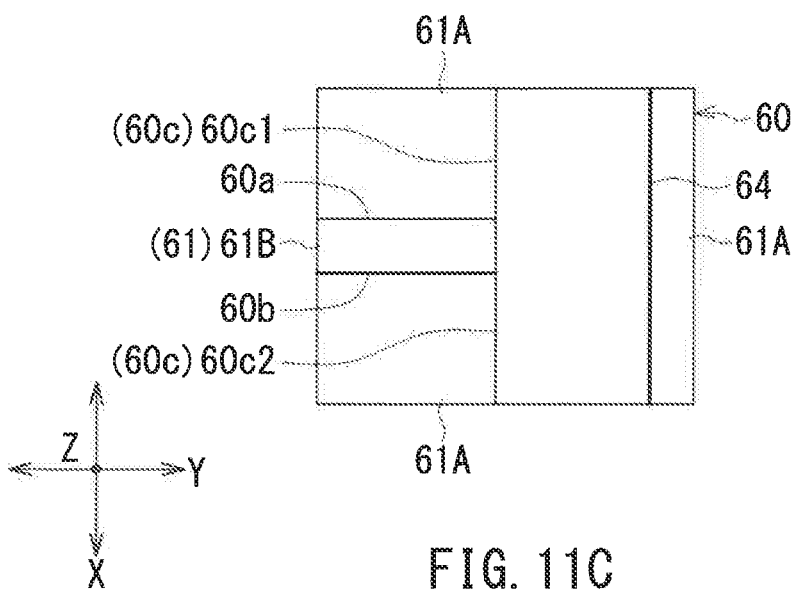
Figure 11D:
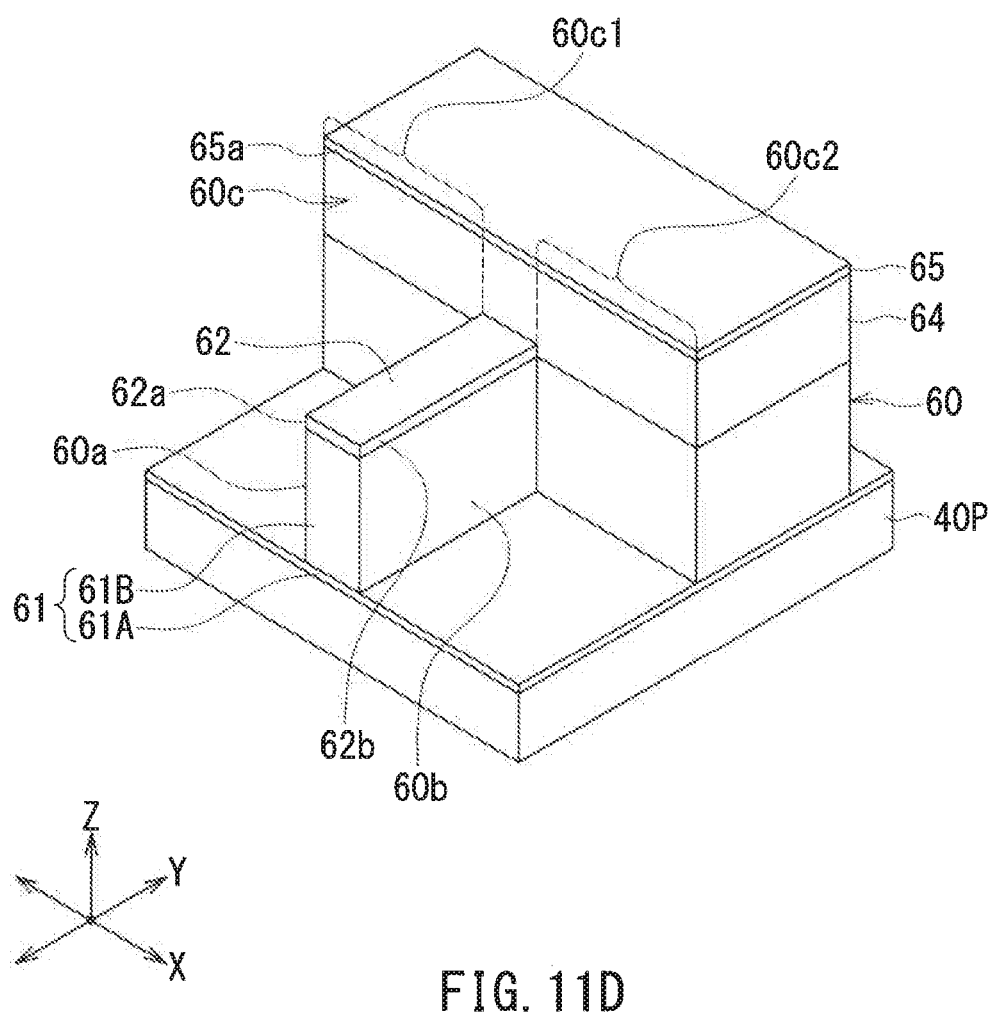

FIGS. 11A to 11D show the next step. This step is to complete the etching mask. In this step, the first and second initial mask layers 61P and 64P are etched into the first and second mask layers 61 and 64, respectively, by using the first and second hard masks 62 and 65. The etching mask 60 is thereby completed. FIG. 11C omits the illustration of the first and second hard masks 62 and 65. The step of forming the etching mask 60 in the present embodiment includes a series of steps illustrated in FIG. 5A through FIG. 11D.

In the case where the first initial mask layer 61P includes the etching stopper layer 61A and the layer to be etched 61B, the step of etching the first and second initial mask layers 61P and 64P etches the second initial mask layer 64P and the layer to be etched 61B until the etching stopper layer 61A is exposed. In such a case, the first mask layer 61 is composed of the etching stopper layer 61A and the layer 61B etched.

The etching mask 60 is provided with a wall face 60a whose position is defined by the end 62a of the first hard mask 62, a wall face 60b whose position is defined by the end 62b of the first hard mask 62, and a wall face 60c whose position is defined by the end 65a of the second hard mask 65. The wall faces 60a and 60b belong to the first mask layer 61. The wall face 60c extends across the first mask layer 61 and the second mask layer 64. The wall face 60a defines the position of the first side surface 41c of the narrow portion 41 to be formed later. The wall face 60b defines the position of the second side surface 41d of the narrow portion 41 to be formed later. The wall face 60c includes a first portion 60c1 defining the position of the first end face portion 42a of the wide portion 42 to be formed later, and a second portion 60c2 defining the position of the second end face portion 42b of the wide portion 42 to be formed later.

As previously mentioned, this step is performed by employing RIE. Where the first initial mask layer 61P includes the first carbon layer and the second initial mask layer 64P is the second carbon layer, an example of the etching conditions for this step is the use of a gas containing $O_2$ as the etching gas.

Figure 12A:
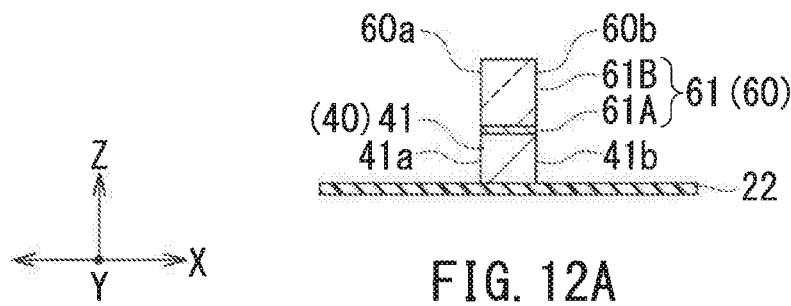
FIGS. 12A to 12C are explanatory diagrams showing a step that follows the step shown in FIGS. 11A to 11D.
Figure 12B:
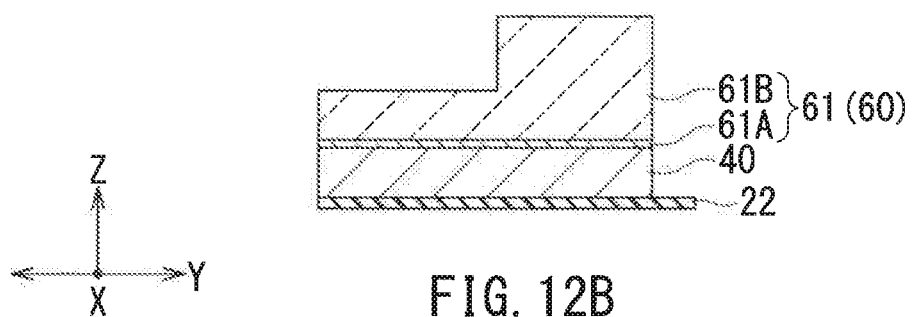
Figure 12C:
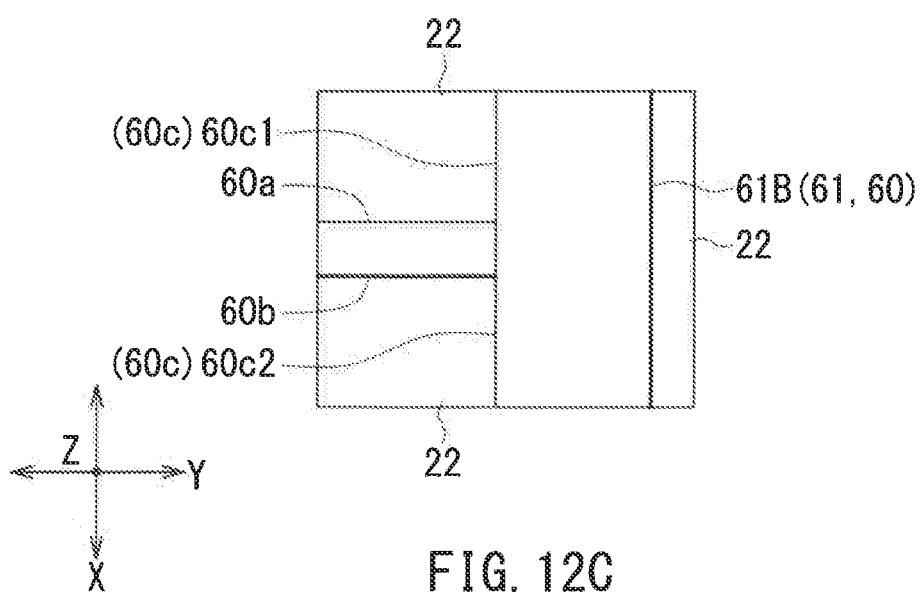

FIGS. 12A to 12C show the next step. In this step, first, the initial plasmon generator 40P is etched into the plasmon generator 40 by using the etching mask 60. In the case where the first mask layer 61 (the first initial mask layer 61P) includes the etching stopper layer 61A, the etching stopper layer 61A is also etched when the initial plasmon generator 40P is etched. The etching mask 60 is then removed.

The step of etching the initial plasmon generator 40P is performed by employing IBE. In this case, the etching mask 60 and the first and second hard masks 62 and 65 are also etched when the initial plasmon generator 40P is etched. FIGS. 12A to 12C illustrate an example in which the second mask layer 64, the first hard mask 62 and the second hard mask 65 have been completely removed by etching.

As described above, in the manufacturing method for the plasmon generator 40 according to the present embodiment, the initial plasmon generator 40P is etched into the plasmon generator 40 by using the etching mask 60. According to the present embodiment, it is possible to accurately form the first mask layer 61 and the second mask layer 64 of the etching mask 60 through the use of the first and second hard masks 62 and 65. The present embodiment thus enables accurate control of the shape of the narrow portion 41 and the wide portion 42 of the plasmon generator 40, and consequently, enables accurate control of the position of boundary between the narrow portion 41 and the wide portion 42.

In the present embodiment, in particular, the wide portion 42 has the first end face portion 42a and the second end face portion 42b located with the proximal end 41b of the narrow portion 41 therebetween. The position of boundary between the narrow portion 41 and the wide portion 42 is defined by the position of the first and second end face portions 42a and 42b. According to the present embodiment, the second mask layer 64 serves to accurately control the position of the first and second end face portions 42a and 42b. The present embodiment thus enables accurate control of the position of boundary between the narrow portion 41 and the wide portion 42.

A mask formed of carbon is advantageous over a mask formed of a material other than carbon in that it has high resistance to dry etching such as IBE and that it is easily removable by ashing. The present embodiment provides these advantages when the first initial mask layer 61P includes the first carbon layer and the second initial mask layer 64P is the second carbon layer.

In the present embodiment, the second resist mask 66 is formed on a flat surface. This enables accurate formation of the second resist mask 66. According to the present embodiment, this also contributes to accurate control of the position of boundary between the narrow portion 41 and the wide portion 42.

Now, the effect of the manufacturing method for the plasmon generator 40 according to the present embodiment will be described in more detail in comparison with a manufacturing method for a plasmon generator of a comparative example. First, the manufacturing method for the plasmon generator of the comparative example will be described with reference to FIGS. 13A to 16C. FIGS. 13A to 16C each show a stack of layers formed in the process of manufacturing a thermally-assisted magnetic recording head. Fig. nA (n is an integer between 13 and 16 inclusive) shows a cross section of the stack taken at the location at which the medium facing surface 80 is to be formed. Fig. nB shows a cross section that intersects the end face of the main pole 26 and that is perpendicular to the medium facing surface 80 and to the top surface 1a of the substrate 1. Fig. nC shows the top surface of part of the stack. Figs. nA and nB, excluding FIGS. 16A and 16B, omit the illustration of portions that are located on the substrate-1 side relative to the initial plasmon generator. FIGS. 16A and 16B omit the illustration of portions below the cladding layer 22.

The manufacturing method for the plasmon generator of the comparative example proceeds through the same steps as those of the manufacturing method for the plasmon generator 40 according to the present embodiment up to the step of forming the first hard mask. The first initial mask layer, the etching stopper layer, the layer to be etched and the first hard mask of the comparative example will be denoted by the symbols 71P, 71A, 71B and 72, respectively. Like the first hard mask 62 of the present embodiment, the first hard mask 72 of the comparative example is provided with an end 72a whose position is defined by the wall face 63a of the first resist mask 63 and an end 72b whose position is defined by the wall face 63b of the first resist mask 63.

Figure 13A:
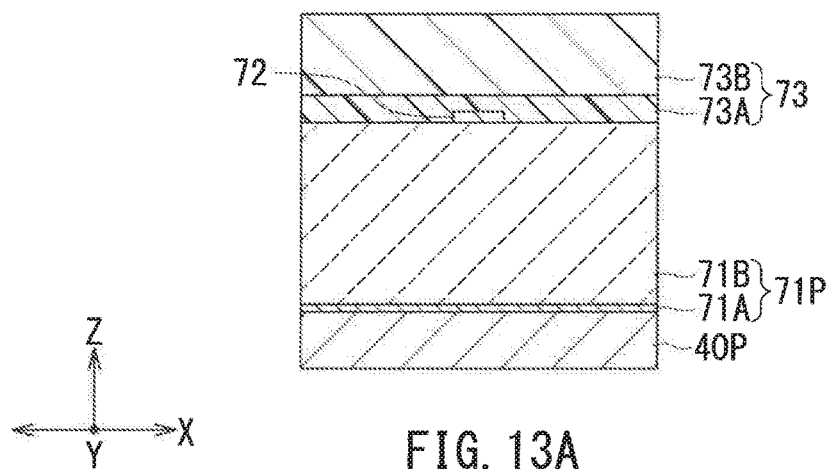
FIGS. 13A to 13C are explanatory diagrams showing a step of a manufacturing method for a plasmon generator of a comparative example.
Figure 13B:
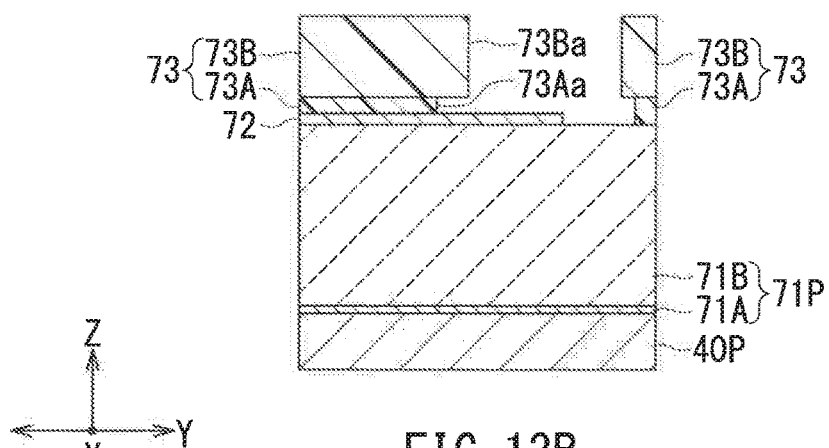
Figure 13C:
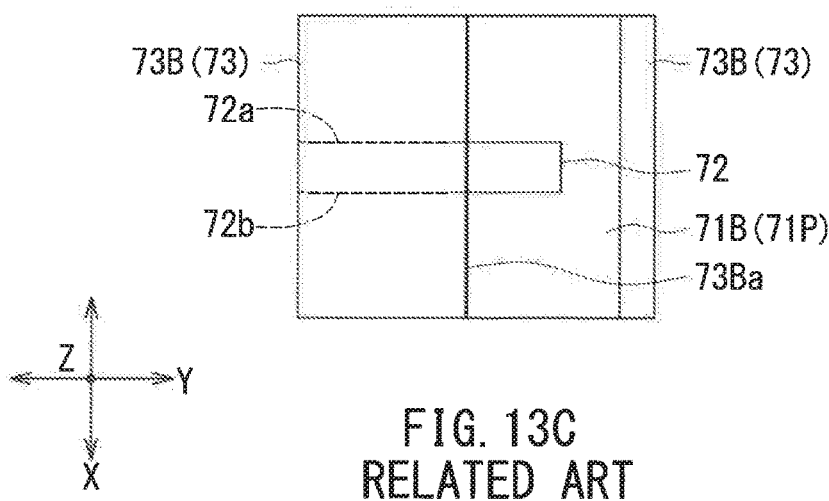

FIGS. 13A to 13C show a step following the formation of the first hard mask 72. In this step, a resist mask 73 for defining the shape of the wide portion 42 is formed on the first initial mask layer 71P and the first hard mask 72 by photolithography. The resist mask 73 is a resist mask to be used in a lift-off process, and has an undercut. As shown in FIGS. 13A and 13B, the resist mask 73 includes a lower layer 73A and an upper layer 73B. The lower layer 73A has an opening 73Aa shaped to correspond to the planar shape of the wide portion 42. The upper layer 73B has an opening 73Ba shaped to correspond to the planar shape of the wide portion 42. The opening 73Aa is larger than the opening 73Ba in planar shape.

Figure 14A:
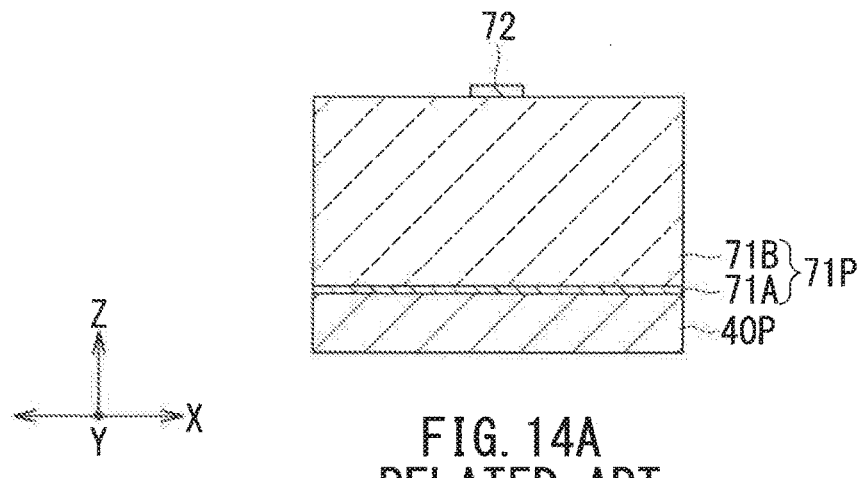
FIGS. 14A to 14C are explanatory diagrams showing a step that follows the step shown in FIGS. 13A to 13C.
Figure 14B:
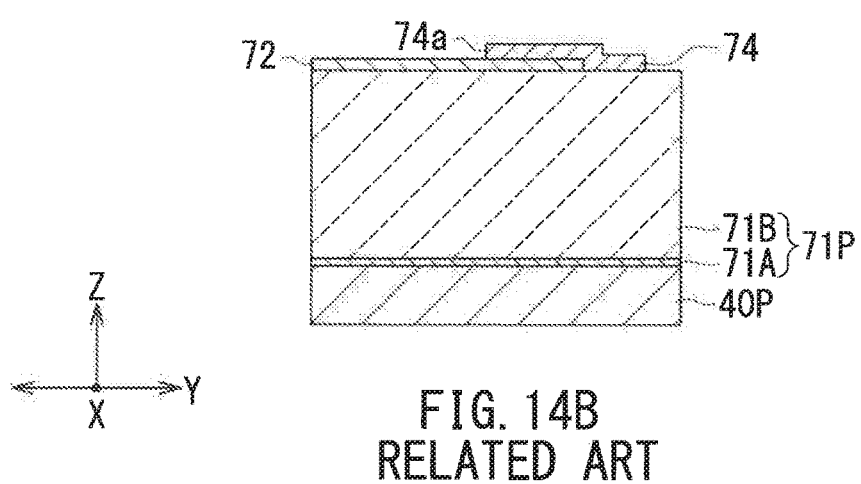
Figure 14C:
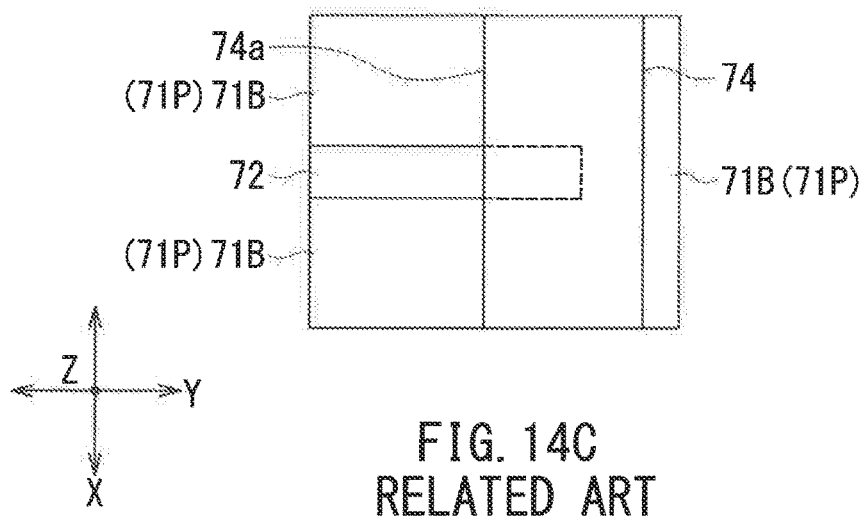

FIGS. 14A to 14C show the next step. In this step, first, a second initial hard mask is formed over the entire top surface of the stack. The second initial hard mask is formed of the same material as the first hard mask 72. Then, the resist mask 73 is lifted off. As a result, the remaining second initial hard mask makes a second hard mask 74. The second hard mask 74 has an end 74a for defining the position of the first and second end face portions 42a and 42b of the wide portion 42.

Figure 15A:
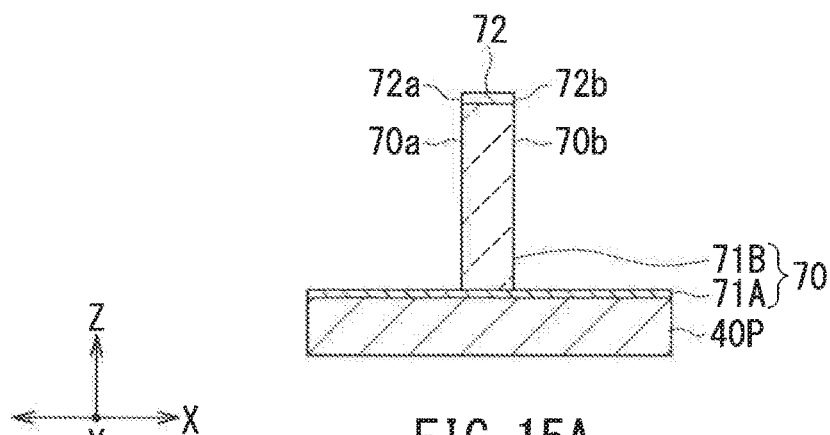
FIGS. 15A to 15C are explanatory diagrams showing a step that follows the step shown in FIGS. 14A to 14C.
Figure 15B:
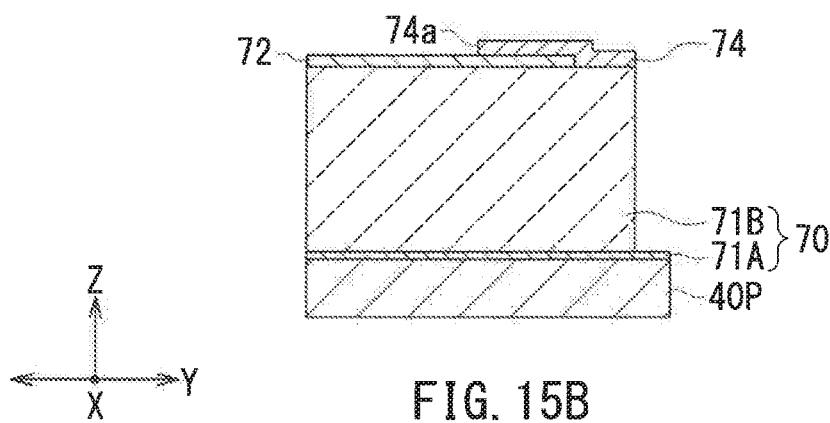
Figure 15C:
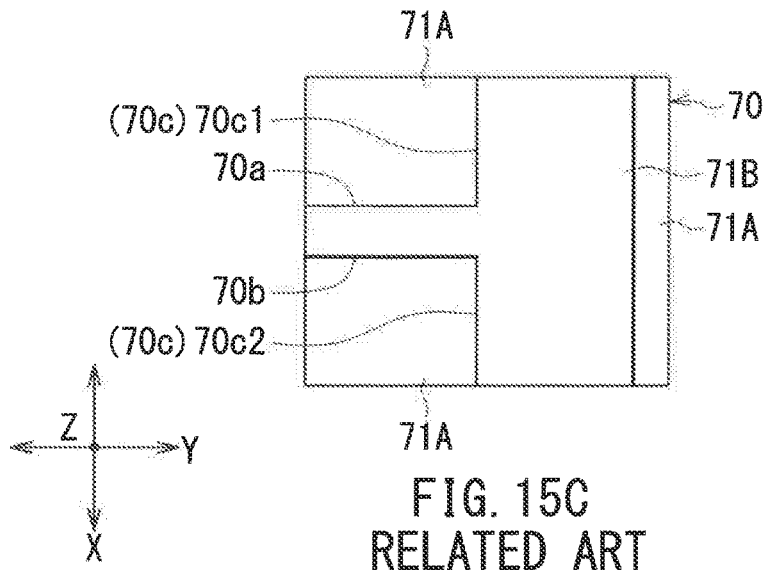
Figure 16A:
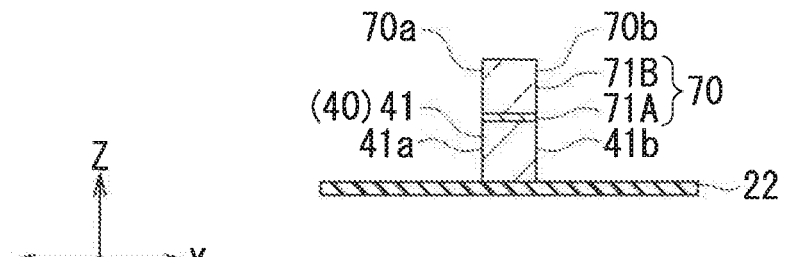
FIGS. 16A to 16C are explanatory diagrams showing a step that follows the step shown in FIGS. 15A to 15C.
Figure 16B:
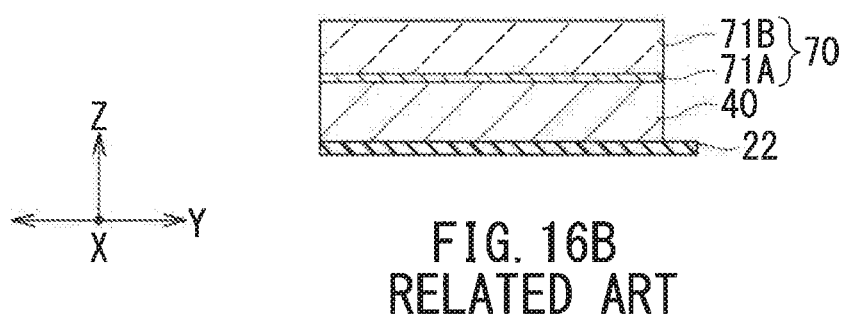

FIGS. 15A to 15C show the next step. In this step, the first initial mask layer 71P is etched by using the first and second hard masks 72 and 74. This makes the first initial mask layer 71P into an etching mask 70. The etching conditions for the first initial mask layer 71P are the same as those for the first and second initial mask layers 61P and 64P of the present embodiment. The etching mask 70 is composed of the etching stopper layer 71A and the layer 71B etched.

The etching mask 70 is provided with a wall face 70a whose position is defined by the end 72a of the first hard mask 72, a wall face 70b whose position is defined by the end 72b of the first hard mask 72, and a wall face 70c whose position is defined by the end 74a of the second hard mask 74. The wall face 70a defines the position of the first side surface 41c of the narrow portion 41 to be formed later. The wall face 70b defines the position of the second side surface 41d of the narrow portion 41 to be formed later. The wall face 70c includes a first portion 70c1 defining the position of the first end face portion 42a of the wide portion 42 to be formed later, and a second portion 70c2 defining the position of the second end face portion 42b of the wide portion 42 to be formed later.

Figure 16C:
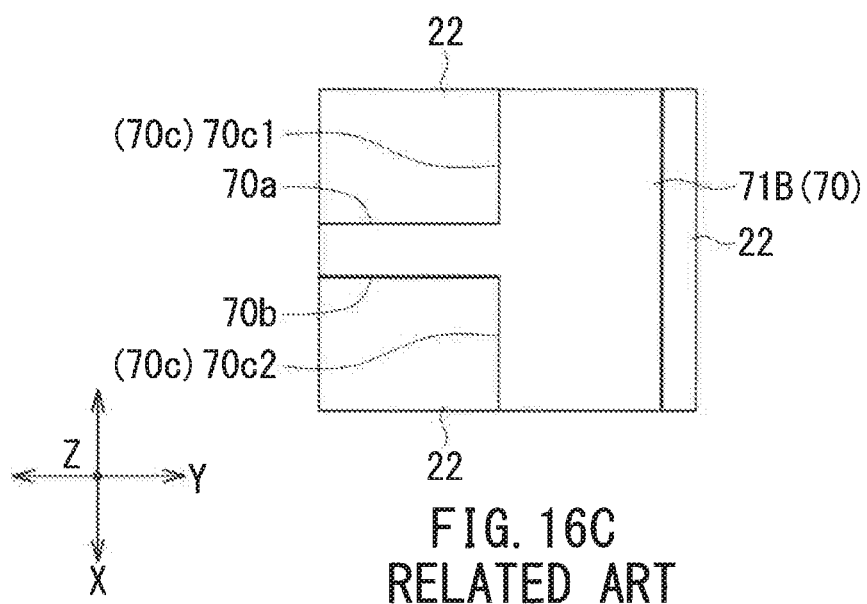

FIGS. 16A to 16C show the next step. In this step, first, the initial plasmon generator 40P is etched into the plasmon generator 40 by using the etching mask 70. The step of etching the initial plasmon generator 40P is performed by employing IBE. The etching stopper layer 71A is also etched when the initial plasmon generator 40P is etched. The etching mask 70 is then removed.

Figure 17:
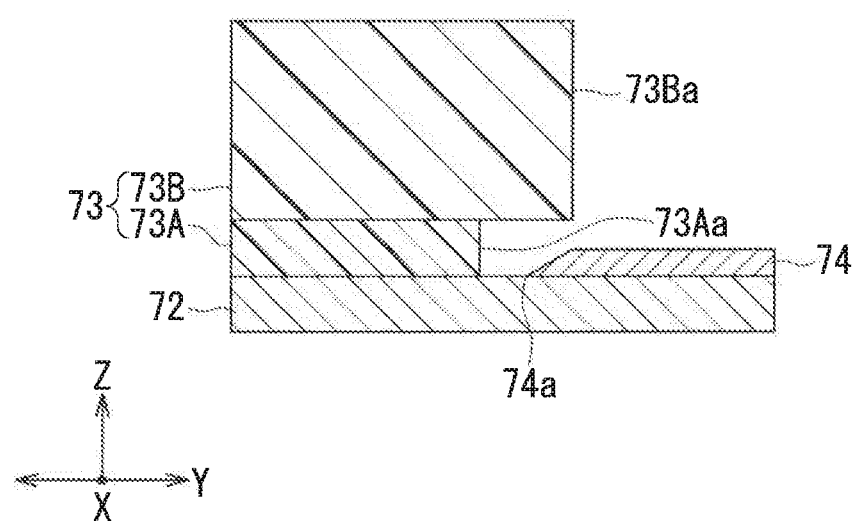
FIG. 17 is a cross-sectional view showing a stack after the formation of a second initial hard mask in the manufacturing method for the plasmon generator of the comparative example.

The comparative example cannot accurately control the position of boundary between the narrow portion 41 and the wide portion 42. This problem will be discussed with reference to FIG. 17. FIG. 17 is a cross-sectional view showing a stack after the formation of the second initial hard mask. FIG. 17 shows the second hard mask 74 in place of the second initial hard mask. According to the comparative example, the position of boundary between the narrow portion 41 and the wide portion 42 is defined by the position of the first and second end face portions 42a and 42b of the wide portion 42. The position of the first and second end face portions 42a and 42b is defined by the end 74a of the second hard mask 74. As shown in FIG. 17, since the resist mask 73 has an undercut, the second hard mask 74 is formed such that a portion thereof extends into the space resulting from the undercut of the resist mask 73. For this reason, the comparative example cannot accurately control the position of the end 74a of the second hard mask 74, and consequently cannot accurately control the position of boundary between the narrow portion 41 and the wide portion 42.

In contrast, according to the present embodiment, the second resist mask 66 has no undercut. This makes it possible to accurately control the position of the end 65a of the second hard mask 65, and consequently allows accurate control of the position of the wall face 60c of the etching mask 60. By virtue of this, the present embodiment allows controlling the position of boundary between the narrow portion 41 and the wide portion 42 with higher accuracy as compared with the comparative example.

Second Embodiment

A manufacturing method for a plasmon generator according to a second embodiment of the invention will now be described. As has been described in relation to the first embodiment, the etching mask used in the step of etching the initial plasmon generator 40P includes the first mask layer for defining the shape of one of the narrow portion 41 and the wide portion 42 and the second mask layer for defining the shape of the other of the narrow portion 41 and the wide portion 42. For the present embodiment, descriptions will be given of the case where the first mask layer defines the shape of the wide portion 42 of the plasmon generator 40 and the second mask layer defines the shape of the narrow portion 41 of the plasmon generator 40.

Reference is now made to FIGS. 18A to 24C to describe the manufacturing method for the plasmon generator 40 according to the present embodiment. FIGS. 18A to 24C each show a stack of layers formed in the process of manufacturing the thermally-assisted magnetic recording head. Fig. nA (n is an integer between 18 and 24 inclusive) shows a cross section of the stack taken at the location at which the medium facing surface 80 is to be formed. Fig. nB shows a cross section that intersects the end face of the main pole 26 and that is perpendicular to the medium facing surface 80 and to the top surface 1a of the substrate 1. Fig. nC shows the top surface of part of the stack. Figs. nA and nB, excluding FIGS. 24A and 24B, omit the illustration of portions that are located on the substrate-1 side relative to the initial plasmon generator. FIGS. 24A and 24B omit the illustration of portions below the cladding layer 22. FIG. 23D is a perspective view of part of the stack.

Figure 18A:
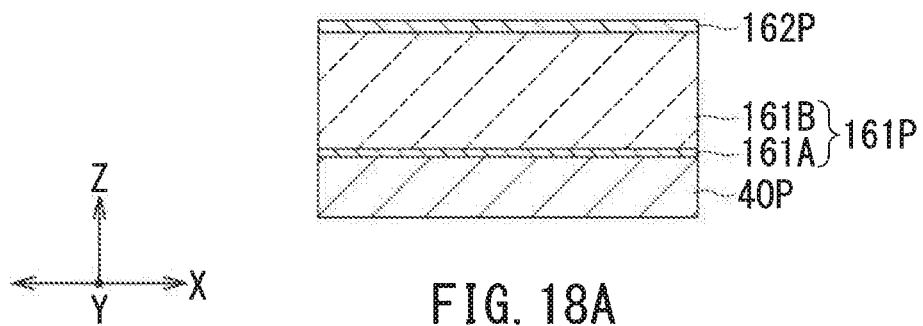
FIGS. 18A to 18C are explanatory diagrams showing a step of a manufacturing method for a plasmon generator according to a second embodiment of the invention.
Figure 18B:
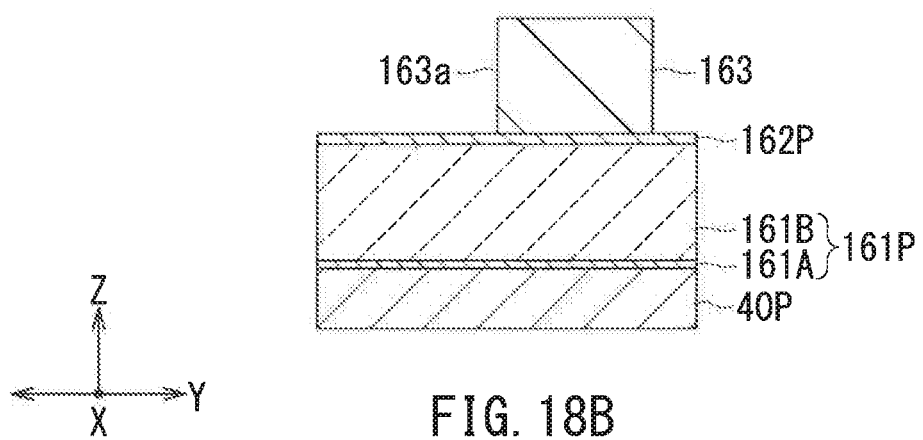
Figure 18C:
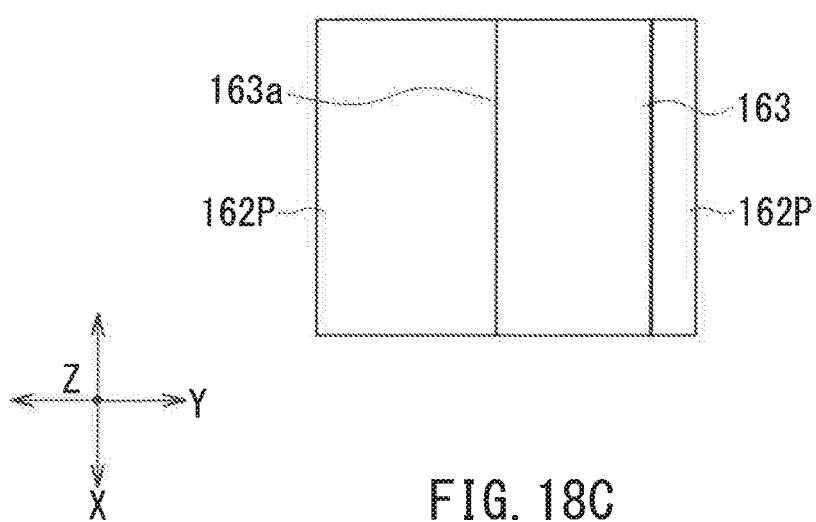

FIGS. 18A to 18C show a step following the formation of the cladding layer 22 (see FIGS. 3 and 4). In this step, first, the initial plasmon generator 40P is formed on the cladding layer 22. Then, a first initial mask layer 161P is formed on the initial plasmon generator 40P. Then, a first initial hard mask 162P is formed on the first initial mask layer 161P.

The first initial mask layer 161P may include an etching stopper layer 161A, and a layer to be etched 161B formed on the etching stopper layer 161A.

In the step shown in FIGS. 18A to 18C, a first resist mask 163 for defining the shape of the first mask layer, i.e., the shape of the wide portion 42, is then formed on the first initial hard mask 162P by photolithography. The planar shape of the first resist mask 163 corresponds to that of the wide portion 42. The first resist mask 163 has a wall face 163a for defining the position of the first and second end face portions 42a and 42b (see FIGS. 1 and 2) of the wide portion 42. The first resist mask 163 does not have any undercut that a resist mask used in a lift-off process would have. The first resist mask 163 is preferably composed of a single layer of photoresist.

The shape of the first resist mask 163 is depicted in a simplified manner in FIGS. 18B and 18C. In other figures illustrating steps subsequent to this step, the shape of any portion defined by the first resist mask 163 is also depicted in a simplified manner.

Figure 19A:
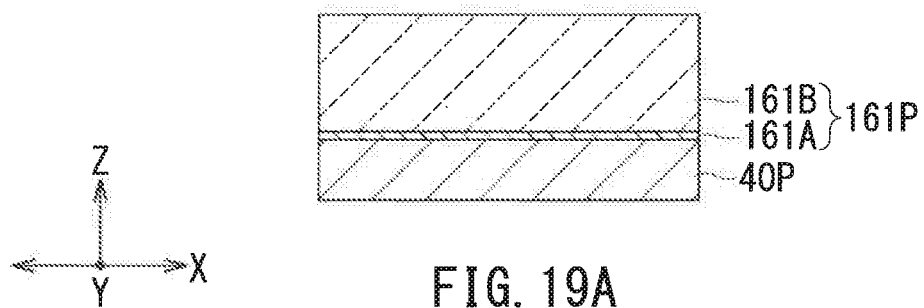
FIGS. 19A to 19C are explanatory diagrams showing a step that follows the step shown in FIGS. 18A to 18C.
Figure 19B:
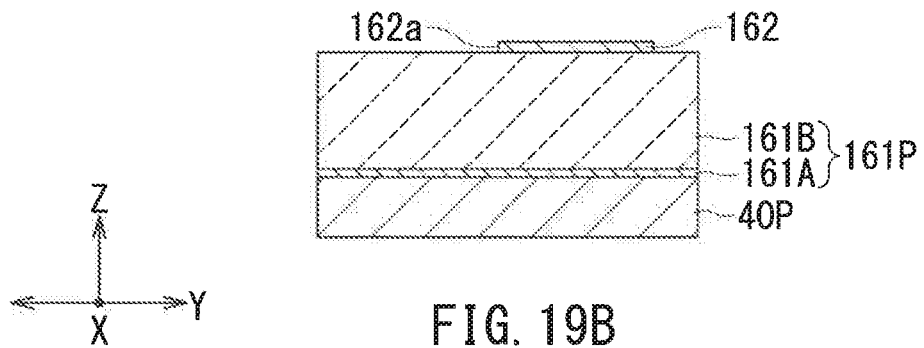
Figure 19C:
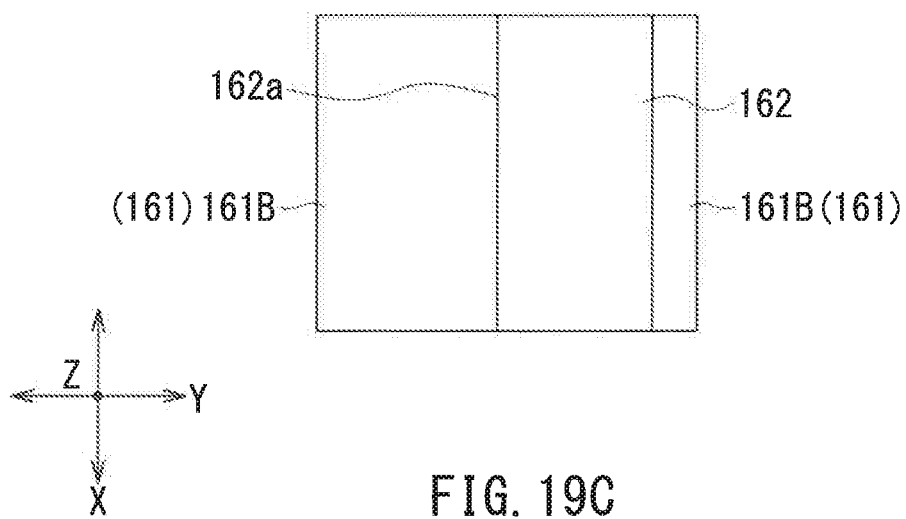

FIGS. 19A to 19C show the next step. In this step, first, the first initial hard mask 162P is etched into a first hard mask 162 by using the first resist mask 163. The first hard mask 162 is provided with an end 162a whose position is defined by the wall face 163a of the first resist mask 163. The first resist mask 163 is then removed. The step of etching the first initial hard mask 162P is performed by employing RIE or IBE.

Figure 20A:
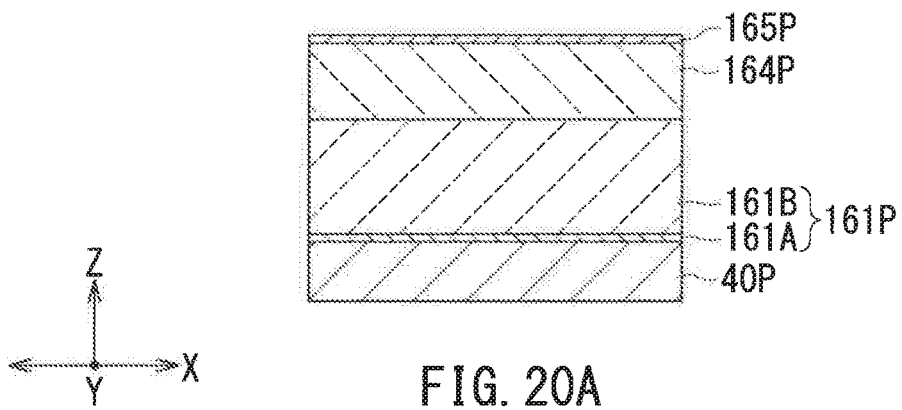
FIGS. 20A to 20C are explanatory diagrams showing a step that follows the step shown in FIGS. 19A to 19C.
Figure 20B:
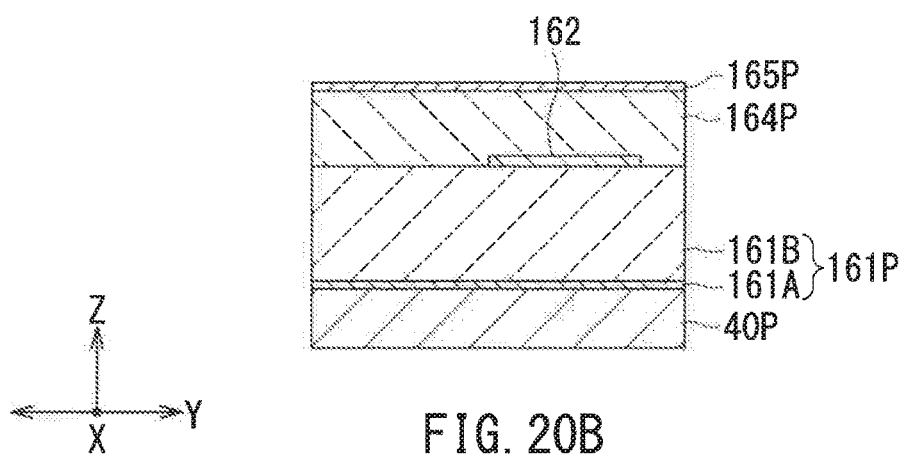
Figure 20C:
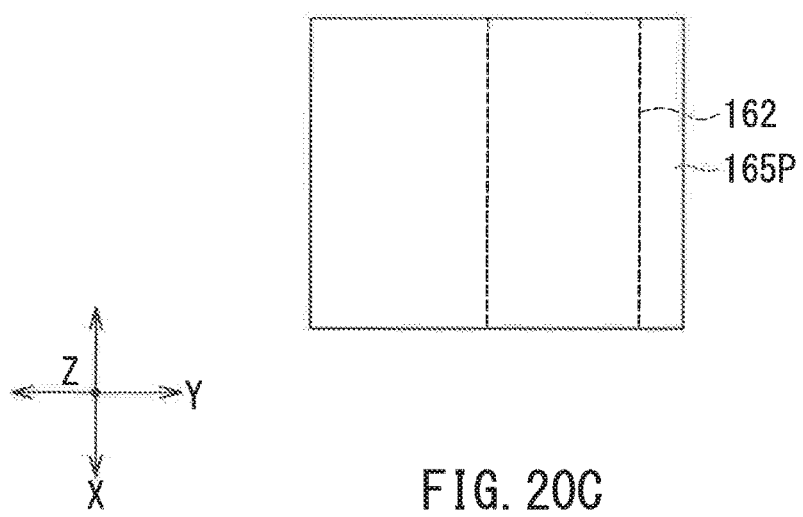

FIGS. 20A to 20C show the next step. In this step, first, a second initial mask layer 164P is formed on the first initial mask layer 161P and the first hard mask 162. Then, a second initial hard mask 165P is formed on the second initial mask layer 164P.

Figure 21A:
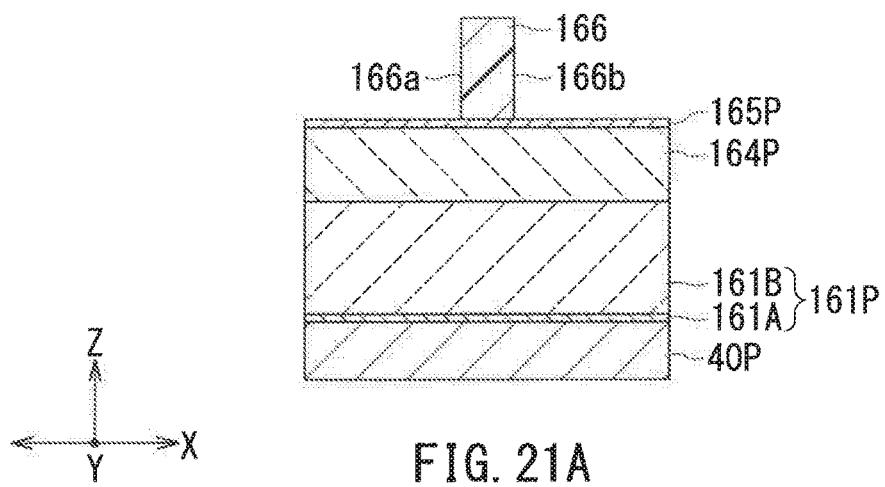
FIGS. 21A to 21C are explanatory diagrams showing a step that follows the step shown in FIGS. 20A to 20C.
Figure 21B:
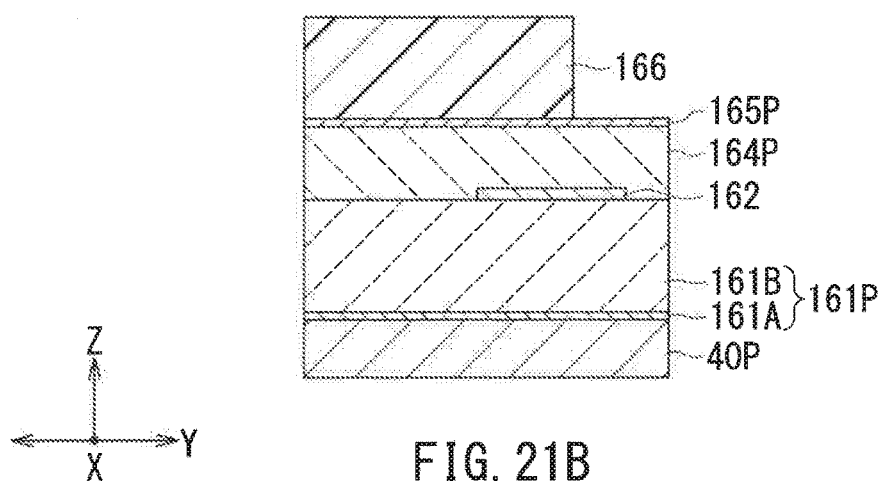
Figure 21C:
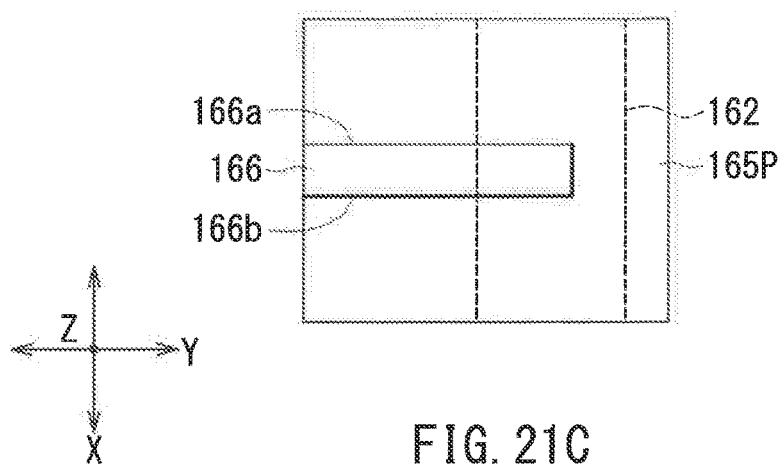

FIGS. 21A to 21C show the next step. In this step, a second resist mask 166 for defining the shape of the second mask layer, i.e., the shape of the narrow portion 41, is formed on the second initial hard mask 165P by photolithography. The planar shape of the second resist mask 166 corresponds to that of the narrow portion 41. The second resist mask 166 has a wall face 166a for defining the position of the first side surface 41c (see FIGS. 1 and 2) of the narrow portion 41 and a wall face 166b for defining the position of the second side surface 41d (see FIGS. 1 and 2) of the narrow portion 41. The second resist mask 166 does not have any undercut that a resist mask used in a lift-off process would have. The second resist mask 166 is preferably composed of a single layer of photoresist.

Figure 22A:
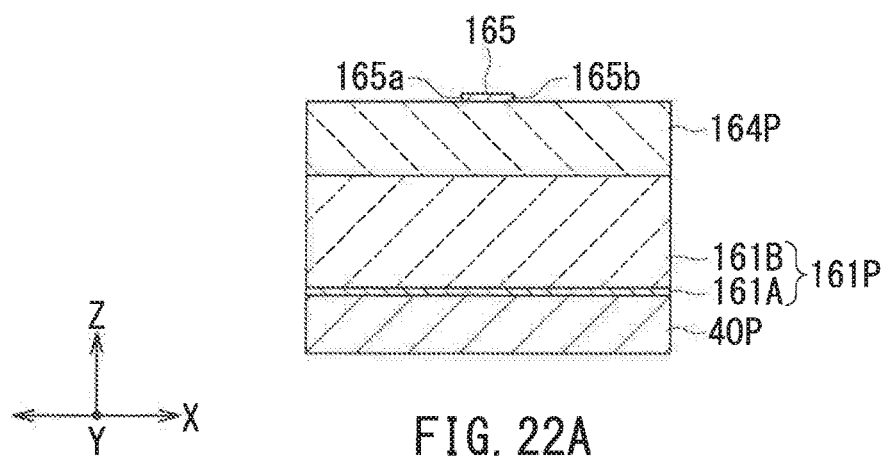
FIGS. 22A to 22C are explanatory diagrams showing a step that follows the step shown in FIGS. 21A to 21C.
Figure 22B:
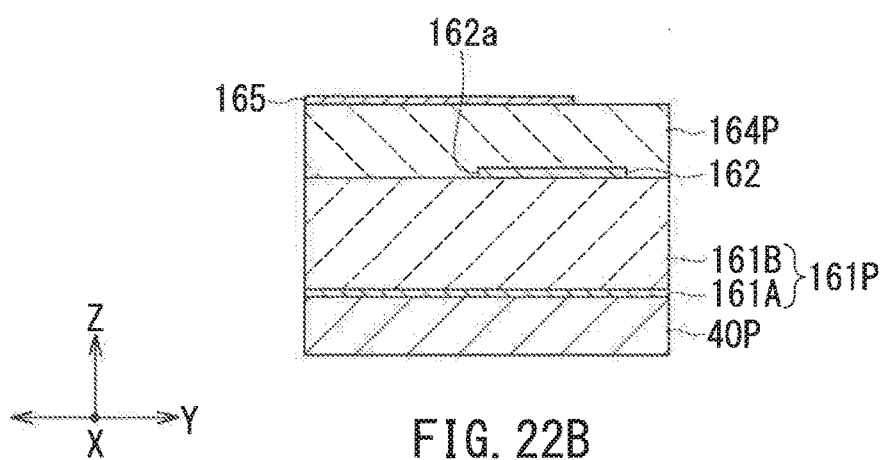
Figure 22C:
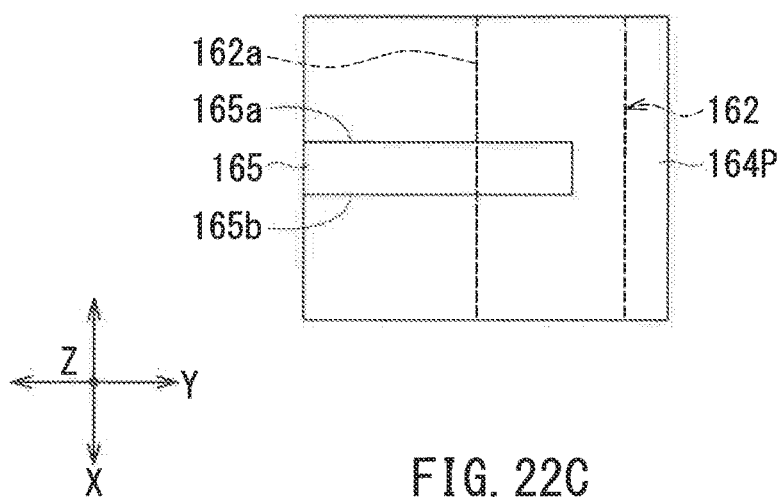

FIGS. 22A to 22C show the next step. In this step, first, the second initial hard mask 165P is etched into a second hard mask 165 by using the second resist mask 166. The second hard mask 165 is provided with an end 165a whose position is defined by the wall face 166a of the second resist mask 166, and an end 165b whose position is defined by the wall face 166b of the second resist mask 166. The ends 165a and 165b are located to intersect the end 162a of the first hard mask 162 as viewed from above. The second resist mask 166 is then removed. The step of etching the second initial hard mask 165P is performed by employing RIE or IBE.

Figure 23A:
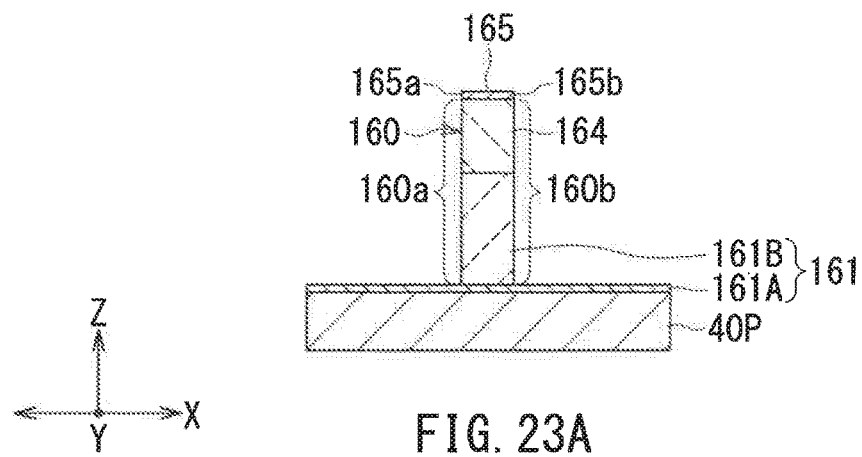
FIGS. 23A to 23D are explanatory diagrams showing a step that follows the step shown in FIGS. 22A to 22C.
Figure 23B:
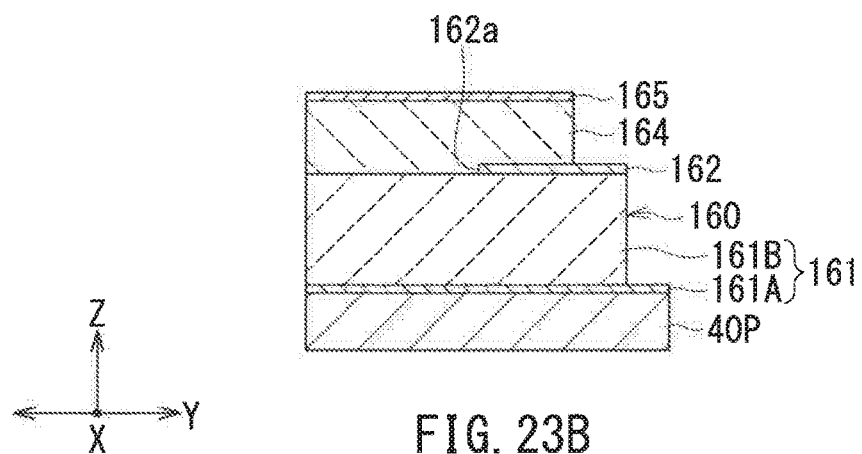
Figure 23C:
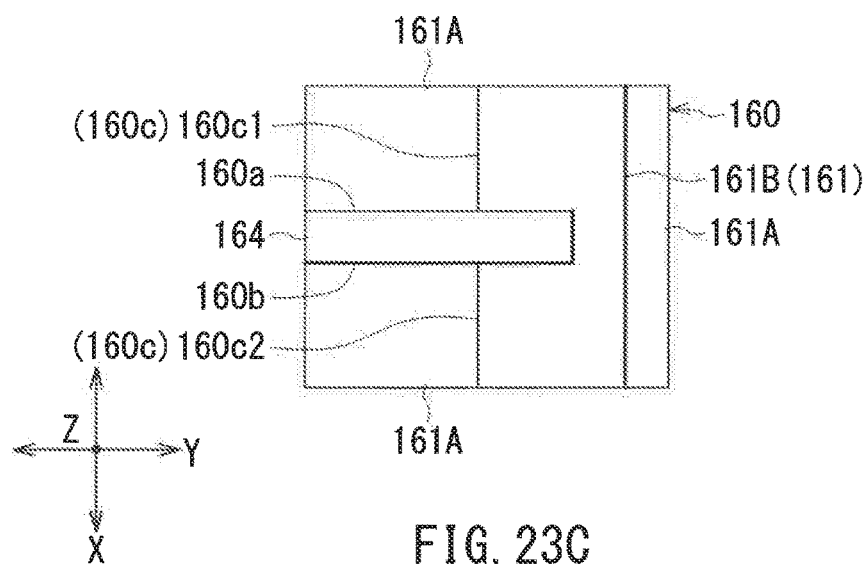
Figure 23D:
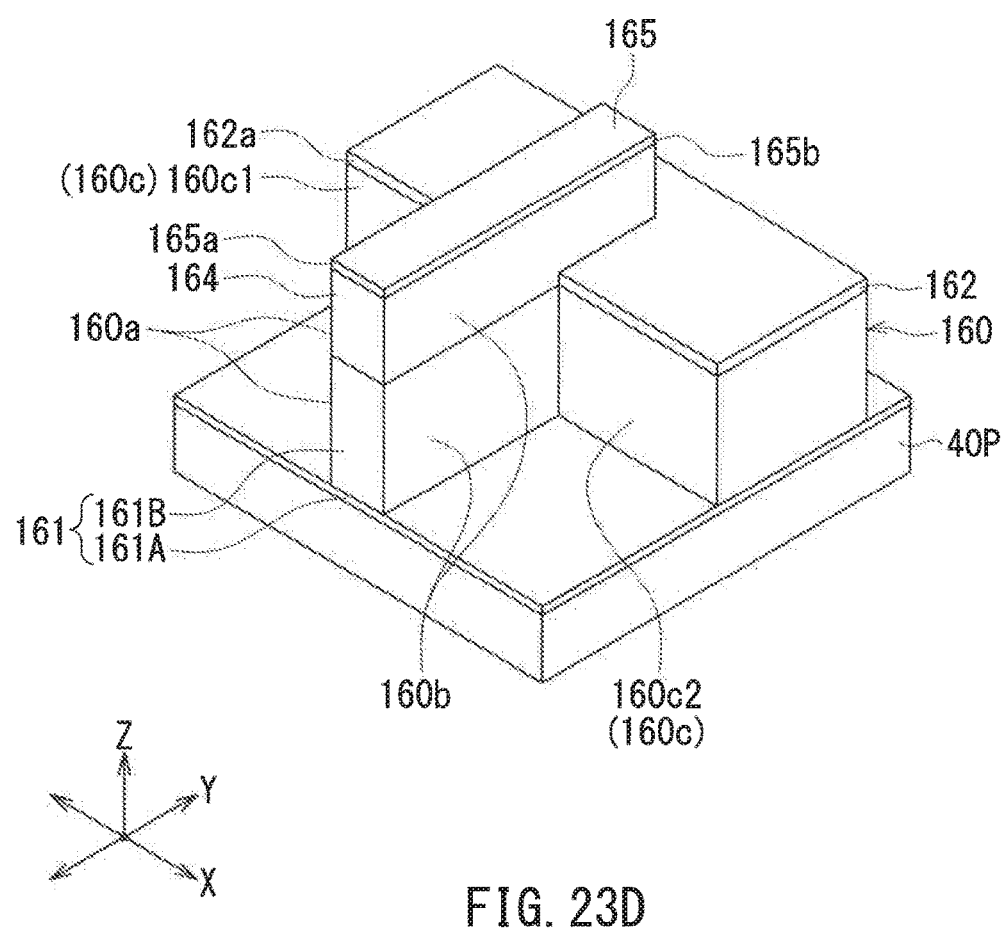

FIGS. 23A to 23D show the next step. This step is to complete the etching mask. In this step, the first and second initial mask layers 161P and 164P are etched into the first and second mask layers 161 and 164, respectively, by using the first and second hard masks 162 and 165. The etching mask 160 is thereby completed. FIG. 23C omits the illustration of the first and second hard masks 162 and 165. The step of forming the etching mask 160 in the present embodiment includes a series of steps illustrated in FIG. 18A through FIG. 23D.

In the case where the first initial mask layer 161P includes the etching stopper layer 161A and the layer to be etched 161B, the step of etching the first and second initial mask layers 161P and 164P etches the second initial mask layer 164P and the layer to be etched 161B until the etching stopper layer 161A is exposed. In such a case, the first mask layer 161 is composed of the etching stopper layer 161A and the layer 161B etched.

The etching mask 160 is provided with a wall face 160a whose position is defined by the end 165a of the second hard mask 165, a wall face 160b whose position is defined by the end 165b of the second hard mask 165, and wall faces 160c1 and 160c2 whose positions are defined by the end 162a of the first hard mask 162. The wall faces 160a and 160b extend across the first mask layer 161 and the second mask layer 164. The wall faces 160c1 and 160c2 belong to the first mask layer 161. The wall face 160a defines the position of the first side surface 41c of the narrow portion 41 to be formed later. The wall face 160b defines the position of the second side surface 41d of the narrow portion 41 to be formed later. The wall face 160c1 defines the position of the first end face portion 42a of the wide portion 42 to be formed later. The wall face 160c2 defines the position of the second end face portion 42b of the wide portion 42 to be formed later. The step of etching the first and second initial mask layers 161P and 164P is performed by employing RIE.

Requirements pertaining to materials and etching conditions for the step of forming the etching mask 160 are the same as the requirements pertaining to materials and etching conditions for the step of forming the etching mask 60 in the first embodiment.

Figure 24A:
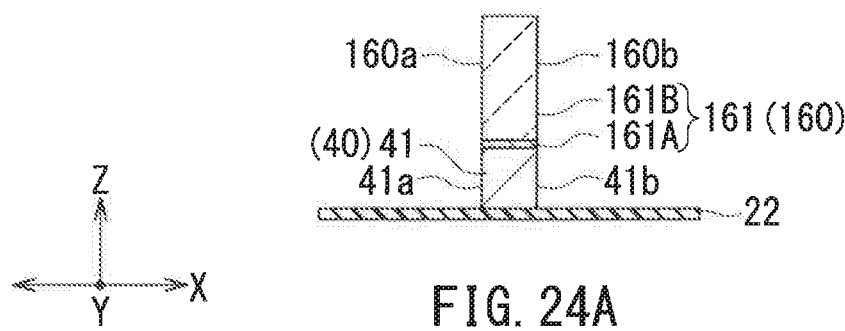
FIGS. 24A to 24C are explanatory diagrams showing a step that follows the step shown in FIGS. 23A to 23D.
Figure 24B:
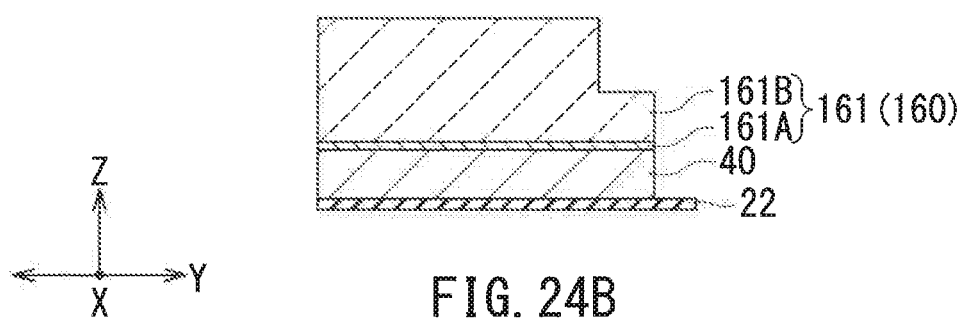
Figure 24C:
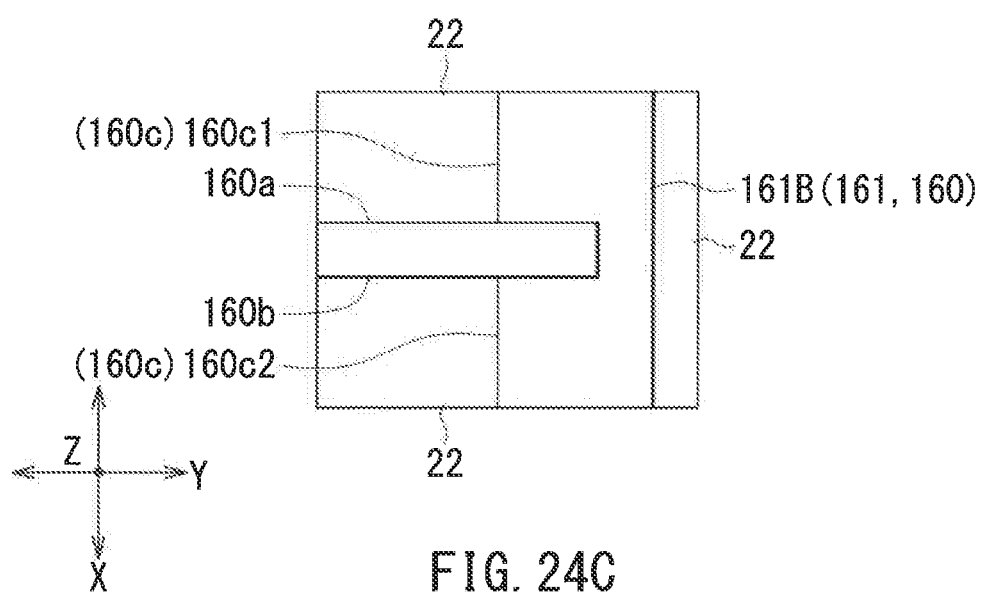

FIGS. 24A to 24C show the next step. In this step, first, the initial plasmon generator 40P is etched into the plasmon generator 40 by using the etching mask 160. In the case where the first mask layer 161 (the first initial mask layer 161P) includes the etching stopper layer 161A, the etching stopper layer 161A is also etched when the initial plasmon generator 40P is etched. The step of etching the initial plasmon generator 40P is performed by employing IBE. The etching mask 160 is then removed.

According to the present embodiment, the first mask layer 161 serves to accurately control the position of the first and second end face portions 42a and 42b. The present embodiment thus enables accurate control of the position of boundary between the narrow portion 41 and the wide portion 42.

The remainder of configuration, function and effects of the present embodiment are similar to those of the first embodiment.

The present invention is not limited to the foregoing embodiments, and various modifications may be made thereto. As far as the requirements of the appended claims are met, the shape and configuration of the etching mask can be freely chosen without being limited to the examples illustrated in the foregoing embodiments. For example, the etching mask may include three or more mask layers of different shapes.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiments.

What is claimed is:

1. A manufacturing method for a plasmon generator comprising a wide portion and a narrow portion protruding from the wide portion, wherein
    the narrow portion has a proximal end which is a boundary with the wide portion, and a near-field light generating surface which is a protruding end,
    the proximal end is located at a distance from an imaginary plane including the near-field light generating surface,
    the wide portion is greater than the narrow portion in maximum width in a first direction parallel to the imaginary plane, and
    the plasmon generator is configured to excite a surface plasmon from light on the wide portion, and to generate near-field light from the surface plasmon at the near-field light generating surface,
    the manufacturing method comprising the steps of:

forming an initial plasmon generator;

forming an etching mask on the initial plasmon generator, the etching mask including a first mask layer for defining the shape of one of the narrow portion and the wide portion and a second mask layer for defining the shape of the other of the narrow portion and the wide portion; and etching the initial plasmon generator into the plasmon generator by using the etching mask, wherein the step of forming the etching mask includes the steps of:

forming a first initial mask layer;

forming a first initial hard mask on the first initial mask layer;

forming a first resist mask on the first initial hard mask by photolithography, the first resist mask being intended for defining the shape of the first mask layer;

etching the first initial hard mask into a first hard mask by using the first resist mask;

forming a second initial mask layer on the first initial mask layer and the first hard mask;

forming a second initial hard mask on the second initial mask layer;

forming a second resist mask on the second initial hard mask by photolithography, the second resist mask being intended for defining the shape of the second mask layer;

etching the second initial hard mask into a second hard mask by using the second resist mask; and etching the first and second initial mask layers into the first and second mask layers, respectively, by using the first and second hard masks.

2. The manufacturing method for the plasmon generator according to claim 1, wherein the first initial mask layer includes a first carbon layer.

3. The manufacturing method for the plasmon generator according to claim 1, wherein the second initial mask layer is a second carbon layer.

4. The manufacturing method for the plasmon generator according to claim 1, wherein the first initial mask layer includes an etching stopper layer, and a layer to be etched which is formed on the etching stopper layer, and the step of etching the first and second initial mask layers etches the layer to be etched and the second initial mask layer until the etching stopper layer is exposed.

5. The manufacturing method for the plasmon generator according to claim 1, wherein the step of etching the first initial hard mask is performed by employing reactive ion etching or ion beam etching.

6. The manufacturing method for the plasmon generator according to claim 1, wherein the step of etching the second initial hard mask is performed by employing reactive ion etching or ion beam etching.

7. The manufacturing method for the plasmon generator according to claim 1, wherein the step of etching the first and second initial mask layers is performed by employing reactive ion etching.

8. The manufacturing method for the plasmon generator according to claim 1, wherein the step of etching the initial plasmon generator is performed by employing ion beam etching.

9. The manufacturing method for the plasmon generator according to claim 1, wherein the wide portion has a first end face portion and a second end face portion located with the proximal end of the narrow portion therebetween, and the first and second end face portions are parallel to the imaginary plane.

10. The manufacturing method for the plasmon generator according to claim 1, wherein the narrow portion has a first side surface and a second side surface which are perpendicular to the first direction.

* * * * *